(12) United States Patent
Kamalanathan et al.

(10) Patent No.: US 9,734,902 B2
(45) Date of Patent: Aug. 15, 2017

(54) RESISTIVE MEMORY DEVICE WITH RAMP-UP/RAMP-DOWN PROGRAM/ERASE PULSE

(71) Applicants: Adesto Technologies Corporation, Sunnyvale, CA (US); Axon Technologies Corporation, Scottsdale, AZ (US)

(72) Inventors: Deepak Kamalanathan, Santa Clara, CA (US); Foroozan Sarah Koushan, San Jose, CA (US); Juan Pablo Saenz Echeverry, Mountain View, CA (US); John Dinh, Dublin, CA (US); Shane C. Hollmer, Grass Valley, CA (US); Michael Kozicki, Phoenix, AZ (US)

(73) Assignees: Adesto Technologies Corporation, Sunnyvale, CA (US); Axon Technologies Corporation, Scottsdale, AZ (US)

( * ) Notice: Subject to any disclaimer, the term of this patent is extended or adjusted under 35 U.S.C. 154(b) by 0 days.

(21) Appl. No.: 14/861,680

(22) Filed: Sep. 22, 2015

(65) Prior Publication Data
US 2016/0012885 A1 Jan. 14, 2016

Related U.S. Application Data

(62) Division of application No. 13/470,030, filed on May 11, 2012, now Pat. No. 9,165,644.

(51) Int. Cl.
*G11C 13/00* (2006.01)
(52) U.S. Cl.
CPC ........ *G11C 13/003* (2013.01); *G11C 13/0002* (2013.01); *G11C 13/0004* (2013.01);
(Continued)

(58) Field of Classification Search
CPC ............ G11C 13/0011; G11C 13/0009; G11C 13/0069; G11C 13/0097; G11C 2013/0071; G11C 2013/0092
See application file for complete search history.

(56) References Cited

U.S. PATENT DOCUMENTS

| 4,434,478 A | 2/1984 | Cook et al. |
| 5,638,320 A | 6/1997 | Wong et al. |

(Continued)

FOREIGN PATENT DOCUMENTS

DE    102004040750 A1    3/2006

OTHER PUBLICATIONS

International Search Report and Written Opinion of Patent Cooperation Treaty (PCT), International Application No. PCT/US2013/040652, Applicant Adesto Technologies Corporation, date of mailing Dec. 2, 2013, 10 pages.

(Continued)

*Primary Examiner* — Andrew Q Tran
(74) *Attorney, Agent, or Firm* — Slater Matsil, LLP

(57) ABSTRACT

In one embodiment, a method of operating a resistive switching device includes applying a signal comprising a pulse on a first terminal of a two terminal resistive switching device having the first terminal and a second terminal. The resistive switching device has a first state and a second state. The pulse includes a first ramp from a first voltage to a second voltage over a first time period. The first time period is at least 0.1 times a total time period of the pulse.

16 Claims, 23 Drawing Sheets

(52) U.S. Cl.
CPC ........ *G11C 13/004* (2013.01); *G11C 13/0007* (2013.01); *G11C 13/0011* (2013.01); *G11C 13/0028* (2013.01); *G11C 13/0061* (2013.01); *G11C 13/0069* (2013.01); *G11C 13/0097* (2013.01); *G11C 2013/0071* (2013.01); *G11C 2013/0092* (2013.01); *G11C 2213/79* (2013.01)

(56) References Cited

U.S. PATENT DOCUMENTS

| | | | |
|---|---|---|---|
| 6,650,153 | B2 | 11/2003 | Zerilli et al. |
| 7,215,568 | B2 | 5/2007 | Liaw et al. |
| 7,289,351 | B1 | 10/2007 | Chen et al. |
| 7,292,469 | B2 | 11/2007 | Lee et al. |
| 7,319,615 | B1 | 1/2008 | Park et al. |
| 7,345,522 | B2 | 3/2008 | Owen |
| 7,372,716 | B2 | 5/2008 | Roehr et al. |
| 7,447,086 | B2 | 11/2008 | Wan et al. |
| 7,542,351 | B2 | 6/2009 | Choy et al. |
| 7,558,099 | B2 | 7/2009 | Morimoto |
| 7,715,235 | B2 | 5/2010 | Cernea |
| 7,848,151 | B2 | 12/2010 | Chan et al. |
| 7,852,657 | B2 | 12/2010 | Happ et al. |
| 7,888,228 | B2 | 2/2011 | Blanchard |
| 7,944,728 | B2 | 5/2011 | Nian et al. |
| 8,400,815 | B2 | 3/2013 | Terada et al. |
| 8,547,725 | B2 | 10/2013 | Kumar et al. |
| 8,659,931 | B1 | 2/2014 | Ertosun |
| 9,165,644 | B2 * | 10/2015 | Kamalanathan |
| 2005/0041498 | A1 | 2/2005 | Resta et al. |
| 2005/0250281 | A1 | 11/2005 | Ufert et al. |
| 2008/0217670 | A1 | 9/2008 | Dahmani |
| 2009/0003035 | A1 | 1/2009 | Philipp et al. |
| 2009/0116280 | A1 | 5/2009 | Parkinson et al. |
| 2010/0020594 | A1 | 1/2010 | De Sandre et al. |
| 2010/0290271 | A1 | 11/2010 | Lung |
| 2011/0058411 | A1 | 3/2011 | Rim |
| 2012/0026786 | A1 | 2/2012 | Castro et al. |
| 2013/0033947 | A1 | 2/2013 | Passerini et al. |
| 2013/0170283 | A1 | 7/2013 | Lan et al. |
| 2013/0301337 | A1 | 11/2013 | Kamalanathan et al. |

OTHER PUBLICATIONS

Chen, A., "Status and Challenges in Ionic Memories," Strategic Technology Group, AMD, Nov. 12, 2008, 34 pages.

Hisashi, S., et al., "Basics of RRAM based on transition metal oxides," International Symposium on Advanced Gate Stack Technoloy, Sep. 29-Oct. 1, 2010, 25 pages.

International Serach Report and Written Opinion for Application No. PCT/US2013/059083, mailed Jan. 3, 2014, 8 pages.

Jo, S.H., "Nanoscale Memristive Devices for Memory and Logic Applications," Dissertation submitted in partial fulfillment of the requirements for the degree of Doctor Philosphy, University of Michigan, 2010, 153 pages.

Kamalanathan, D., "Kinetics of Programmable Metallization Cell Memory," A Dissertation Presented in Partial Fulfillment of the Requirements for the Degree Doctor of Philosophy, Arizona State University, May 2011, 140 pages.

Kozicki, M. N., et al., "Non-Volatile Memory Based on Solid Electrolytes," Non-Volatile Memory Technology Symposium, 2004, 8 pages.

Kozicki, M., "Programmable Metallization Cell: From Academic Research to a Market Place," Axon Technologies, 1 page.

Valov, I., et al., "Electrochemical Metallization memories-fundamentals, applications, prospects," Nanotechnology, 2011, 22 pages.

Wong, H.-S. P., "Emerging Memories," Center for Integrated Systems, Stanford University, Apr. 3, 2008, 77 pages.

Wong, H.-S. P., "Phase Change Memory," Proceedings of the IEEE, vol. 98, No. 12, Dec. 2010, pp. 2201-2227.

* cited by examiner

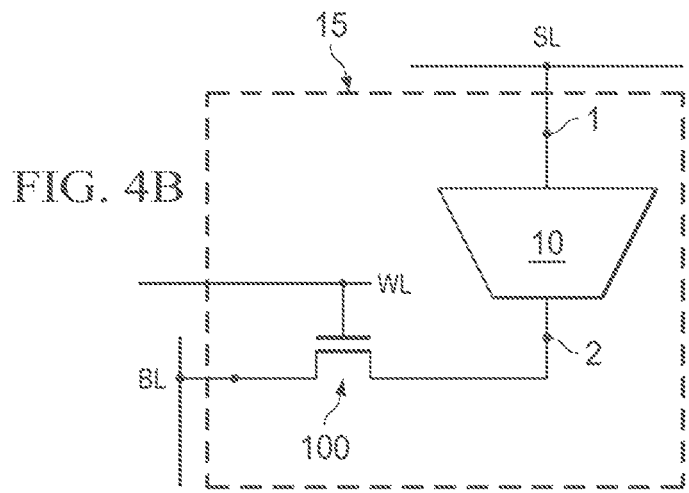
FIG. 4B
(PRIOR ART)
FIG. 5A
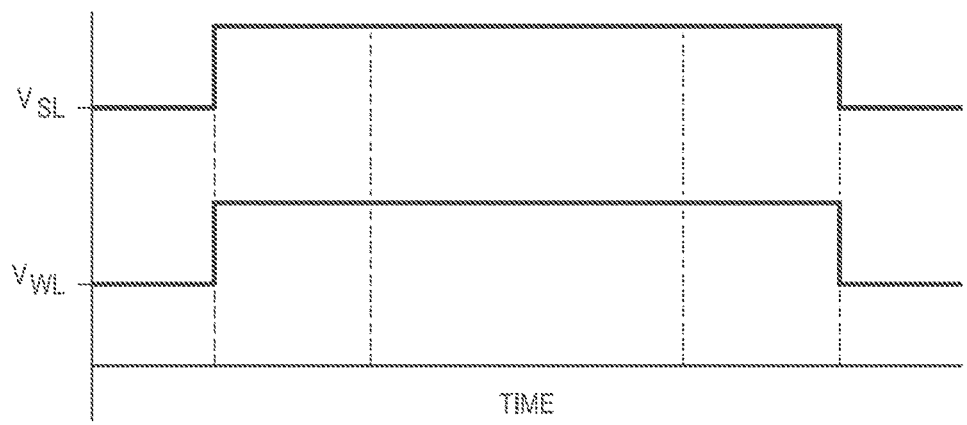
FIG. 5B
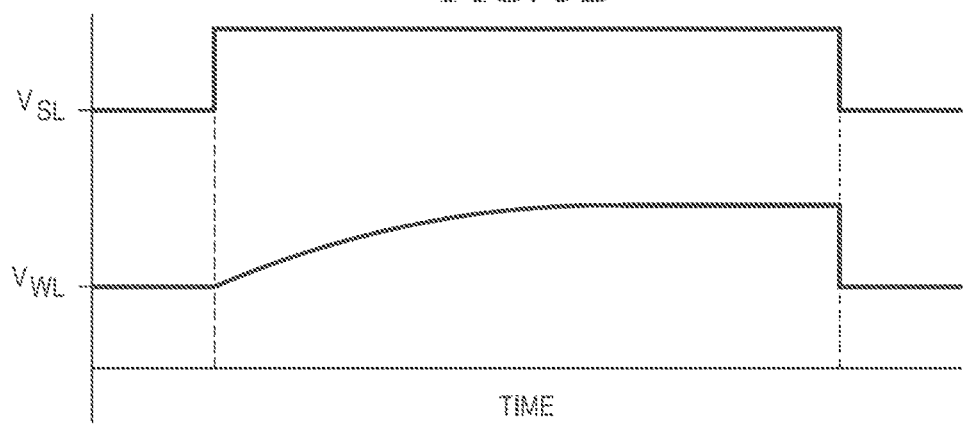

RESISTIVE MEMORY DEVICE WITH RAMP-UP/RAMP-DOWN PROGRAM/ERASE PULSE

The present invention is a divisional application of U.S. application Ser. No. 13/470,030 filed on May 11, 2012, which is incorporated herein by reference in entirety.

TECHNICAL FIELD

The present invention relates generally to semiconductor devices, and in particular to resistive devices and methods of operation thereof.

BACKGROUND

Semiconductor industry relies on device scaling to deliver improved performance at lower costs. Flash memory is the mainstream non-volatile memory in today's market. However, Flash memory has a number of limitations that is posing a significant threat to continued advancement of memory technology. Therefore, the industry is exploring alternative memories to replace Flash memory. Contenders for future memory technology include magnetic storage random access memory (MRAM), ferroelectric RAM (Fe-RAM), and resistive switching memories such as phase change RAM (PCRAM), resistive RAM (RRAM), ionic memories including programmable metallization cell (PMC) or conductive bridging random access memory (CBRAM). These memories are also called as emerging memories.

To be viable, the emerging memory has to be better than Flash memory in more than one of technology metrics such as scalability, performance, energy efficiency, On/Off ration, operational temperature, CMOS compatibility, and reliability. CBRAM technology has shown promising results in many of these technology metrics.

SUMMARY OF THE INVENTION

These and other problems are generally solved or circumvented, and technical advantages are generally achieved, by illustrative embodiments of the present invention.

In accordance with an embodiment of the present invention, a method of operating a resistive switching device includes applying a signal comprising a pulse on a first terminal of a two terminal resistive switching device having the first terminal and a second terminal. The resistive switching device has a first state and a second state. The pulse includes a first ramp from a first voltage to a second voltage over a first time period. The first time period is at least 0.1 times a total time period of the pulse.

In accordance with another embodiment of the present invention, a method applying a signal comprising a pulse on a first access terminal of an access device having the first access terminal and a second access terminal. The second access terminal is coupled to a first terminal of a two terminal resistive switching device. The resistive switching device has the first terminal and a second terminal. The resistive switching device has a first state and a second state. The pulse comprises a first ramp from a first voltage to a second voltage over a first time period. The first time period is at least 0.1 times a total time period of the pulse, and the resistive switching device changes from the first state to the second state after applying the signal.

In accordance with another embodiment of the present invention, a semiconductor device comprises a two terminal resistive switching device, a signal generator, and an access circuit. The two terminal resistive switching has a first terminal and a second terminal. The two terminal resistive switching device further has a first state and a second state. The signal generator is configured to generate a signal comprising a pulse. The pulse comprises a first ramp from a first voltage to a second voltage over a first time period. The first time period is at least 0.1 times a total time period of the pulse. The access circuit is configured to apply the signal on the first terminal. The resistive switching device is configured to change from the first state to the second state in response to the signal.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1E, illustrates cross-sectional view and operation of a resistive switching memory, wherein FIG. 1A illustrates a cross-sectional view of a conventional ionic memory, wherein FIG. 1B illustrates the memory under a programming operation, wherein FIG. 1D illustrates a timing diagram of the corresponding programming pulse, wherein FIG. 1C illustrates the memory under an erase operation, and wherein FIG. 1E illustrates a timing diagram of the corresponding erase pulse;

FIG. 3, which includes

FIG. 4, which includes FIGS. 4A-4B, illustrates a memory cell in accordance with embodiments of the invention;

FIG. 5, which includes FIGS. 5A-5L, illustrates timing diagrams of program operations highlighting the program pulses asserted at a word line in accordance with embodiments of the invention;

FIG. 7, which includes

FIG. 8, which

FIG. 9, which includes

FIG. 9 is illustrated for understanding purposes and actual physical mechanisms may be more complex;

FIG. 10, which includes

FIG. 11, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely ionic memories such as conductive bridging memories. The invention may also be applied, however, to other types of memories, particularly, to any resistive memory such as two terminal resistive memories. Although described herein for a memory device, the embodiments of the invention may also be applied to other types of devices formed by resistive switching such as processors, dynamically-reroutable electronics, optical switches, field-programmable gate arrays, and microfluidic valves as well as other nanoionic devices.

Figure 1A:
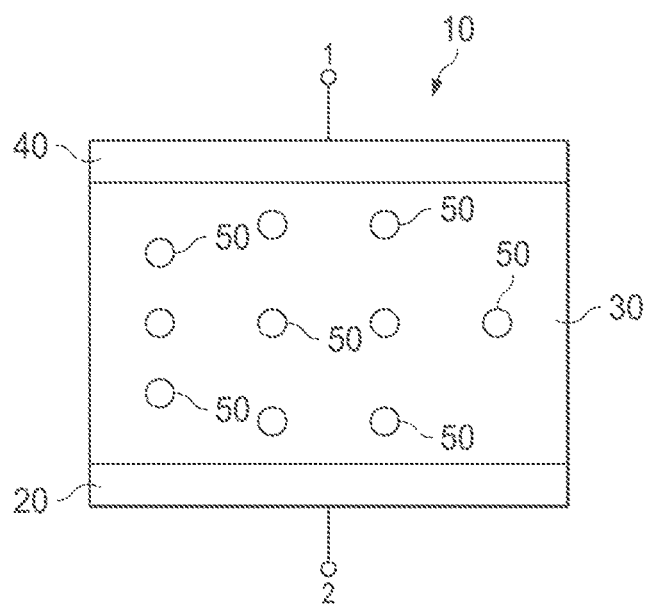
Figure 1B:
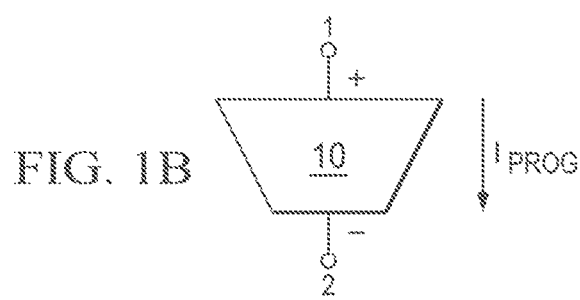
Figure 1C:
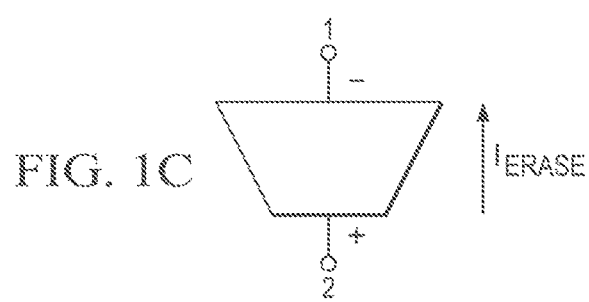
Figure 1D:
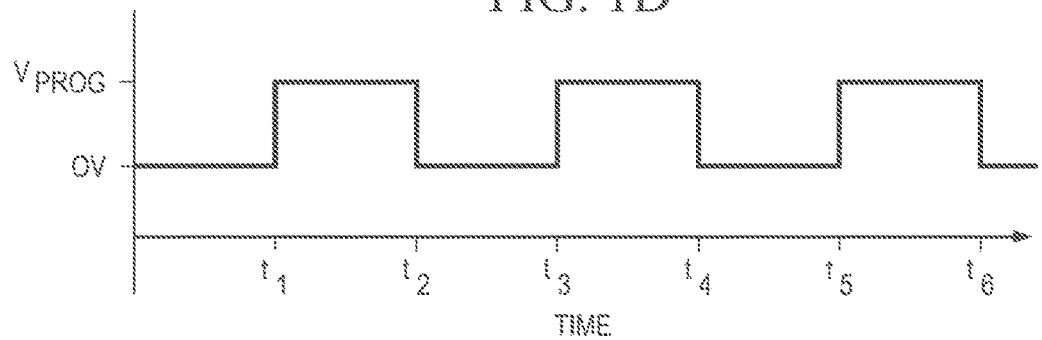
Figure 1E:
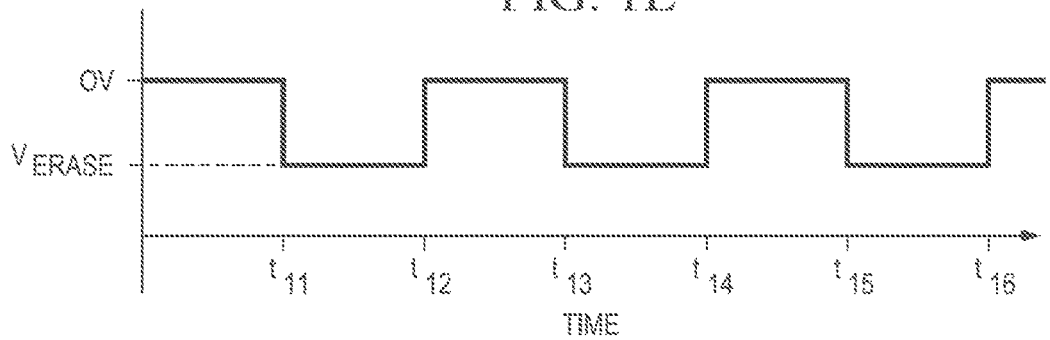

FIG. 1, which includes FIGS. 1A-1E, illustrates cross-sectional view and operation of a resistive switching memory, wherein FIG. 1A illustrates a cross-sectional view of a conventional ionic memory, wherein FIG. 1B illustrates the memory under a programming operation, wherein FIG. 1D illustrates a timing diagram of the corresponding programming pulse, wherein FIG. 1C illustrates the memory under an erase operation, and wherein FIG. 1E illustrates a timing diagram of the corresponding erase pulse.

FIG. 1A illustrates a memory unit 10 having a variable resistance layer 30 placed between a first conductive layer 20 and a second conductive layer 40. The variable resistance layer 30 may be a solid electrolyte layer that is programmable, for example, by the application of external stimuli such as electric potential, heat, magnetic field, and others. In other words, the resistance across the variable resistance layer 30 may be changed by the application of a program operation and a corresponding erase operation. For example, after a program operation, the variable resistance layer 30 has a low resistance (ON state) whereas after an erase operation, the variable resistance layer 30 has a high resistance (OFF state). The operation of the memory cell involves nano-scale migration and rearrangement of conductive atoms such as metal atoms through the variable resistance layer 30. Alternatively, the memory cell may operate due to the motion of defects such as point defects within the variable resistance layer 30. The program/erase operations may be performed by applying an electrical signal between a first node 1 and a second node 2.

As illustrated in FIG. 1A, nanophases 50 may be disbursed within the variable resistance layer 30. In some embodiments, the nanophases 50 may be conductive. However, the resistivity of this variable resistance layer 30 in the OFF state is high, for example, greater than 500 MΩ and depends on the cell area. The resistivity state of the memory cell can be read by applying a read voltage between the first and the second nodes 1 and 2. However, the read voltage is negligible (typically about −200 mV to about 200 mV) and does not change the state of the memory cell.

FIG. 1B illustrates the memory unit during a conventional program operation. The programming operation may be accomplished using a static voltage or a dynamic pulse. Typically programming is performed using a programming pulse as illustrated in FIG. 1D, which illustrates the potential difference applied between the first node 1 and the second node 2.

When a positive voltage is applied across the first and the second nodes 1 and 2 as illustrated in FIGS. 1B and 1D, conductive atoms from the second conductive layer 40 may be oxidized forming conductive ions, which are then accelerated due to the electric field in the variable resistance layer 30. The programming pulse, e.g., depending on the variable resistance layer 30, may have a potential $V_{PROG}$ higher than the threshold voltage, which is about 300 mV or higher and typically about 450 mV in one example. For example, the programming pulse may have a potential $V_{PROG}$ of about 1 V to about 1.5V. The conductive ions drift towards the first conductive layer 20, which may be the cathode. Within the variable resistance layer 30, the conductive ions may migrate using nanophases 50, which may absorb a drifting conductive ion and release the same or another conductive ion. Eventually, a conductive ion close to the first conductive layer absorbs an electron from the second node 2 and is reduced back to a conductive atom. The reduced conductive atom is deposited over the first conductive layer 20. During the programming pulse, more and more conductive ions are brought from the second conductive layer 40 to the first conductive layer 20, which eventually results in the formation of a conductive filament within the variable resistance layer 30. The flow of the conductive ions also results in the flow of the programming current $I_{PROG}$ through the variable resistance layer 30. After the bridging of the first conductive layer 20 with the second conductive layer 40 through the variable resistance layer 30, the resistivity of the variable resistance layer 30 drops significantly and may be measured/read using a read operation.

FIG. 1C illustrates the memory unit during a conventional erase operation. The erase operation may be accomplished using a static voltage or a dynamic pulse. Typically erasure is performed using an erase pulse as illustrated in FIG. 1E, which illustrates the potential difference applied between the first node 1 and the second node 2.

When a negative voltage is applied across the first and the second nodes 1 and 2 as illustrated in FIGS. 1C and 1E, conductive atoms in the conductive filament formed previously get oxidized to conductive ions, which drift to the second conductive layer 40 due to the electric field. At the second conductive layer 40, these conductive ions absorb electrons from the first node 1 and are reduced to conductive atoms reforming the initial high resistivity state. The flow of the conductive ions towards the second conductive layer 40 results in the flow of the erase current $I_{ERASE}$ through the variable resistance layer 30. Unlike the second conductive layer 40, the first conductive layer 20 is inert and therefore does not contribute conductive atoms. Therefore, the erase process terminates upon the relocation of all the conductive atoms within the variable resistance layer 30. In one embodiment, the erase pulse may have a potential $V_{ERASE}$ less than about −200 mV (more negative), for example, about −1V.

As illustrated above, the programming and erase pulse are step functions, where the pulse voltage is abruptly changed from the low state (e.g., 0V) to a high state (e.g., $V_{PROG}$). In other words, programming and erase are conventionally performed using a series of square/rectangular pulses. As will be described in FIGS. 2 and 4, embodiments of the invention use a different voltage pulse for programming and erasing the memory unit.

Figure 2A:
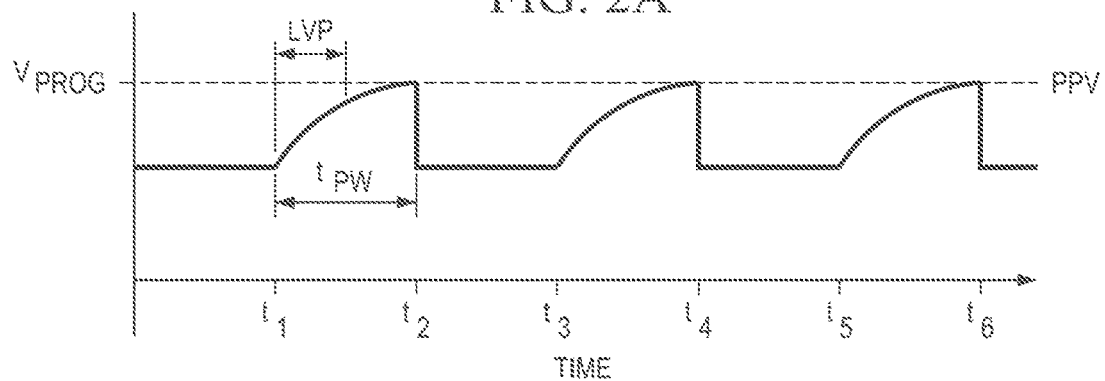
FIGS. 2A-2N, illustrates timing diagrams highlighting a programming pulse applied to a memory unit in accordance with embodiments of the invention.
Figure 2B:
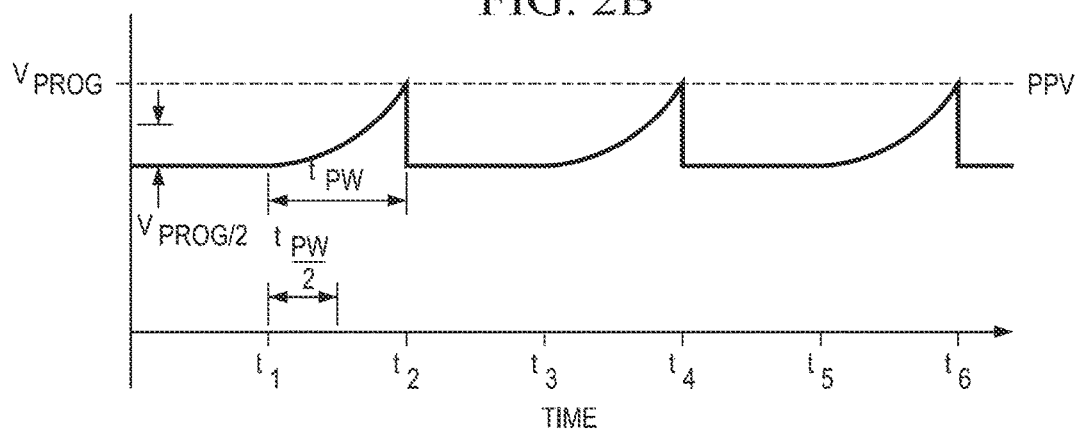
FIG. 2, which includes
Figure 2C:
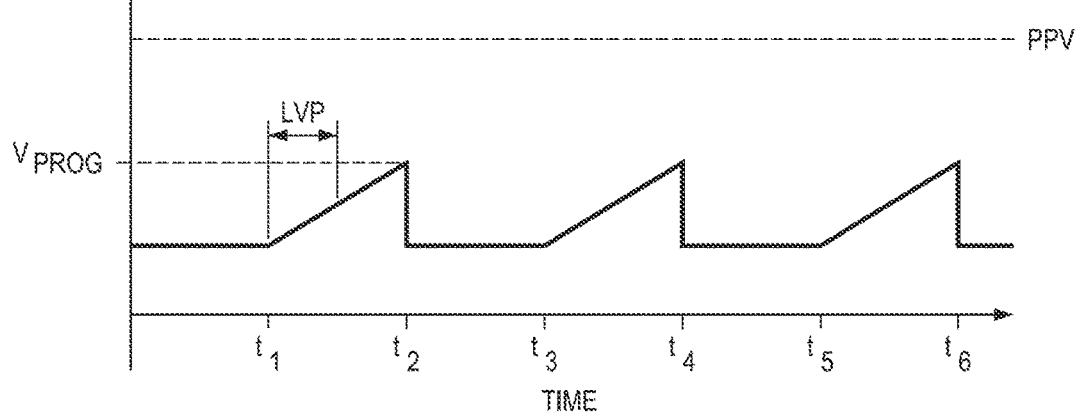
Figure 2D:
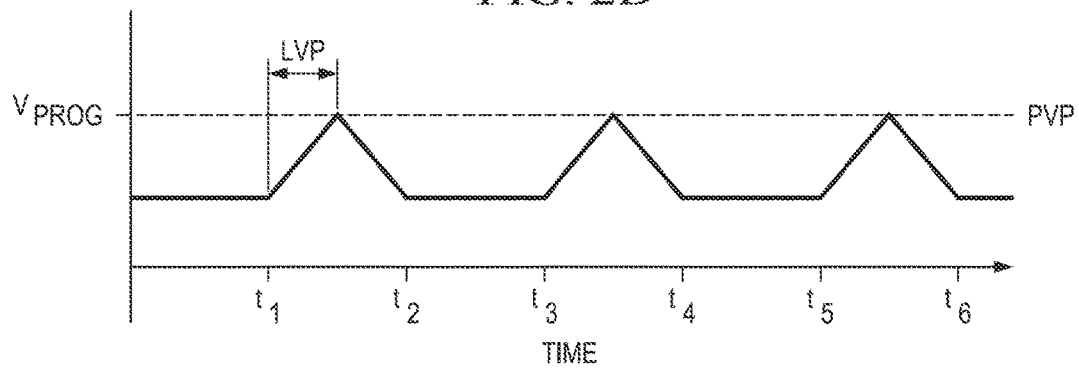
Figure 2E:
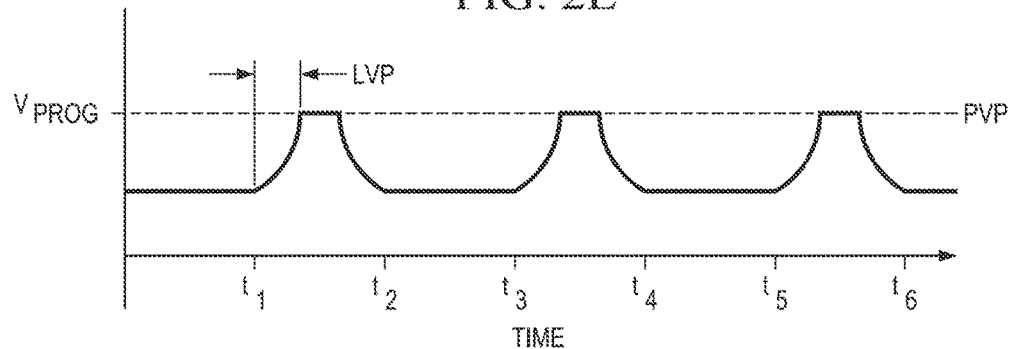
Figure 2F:
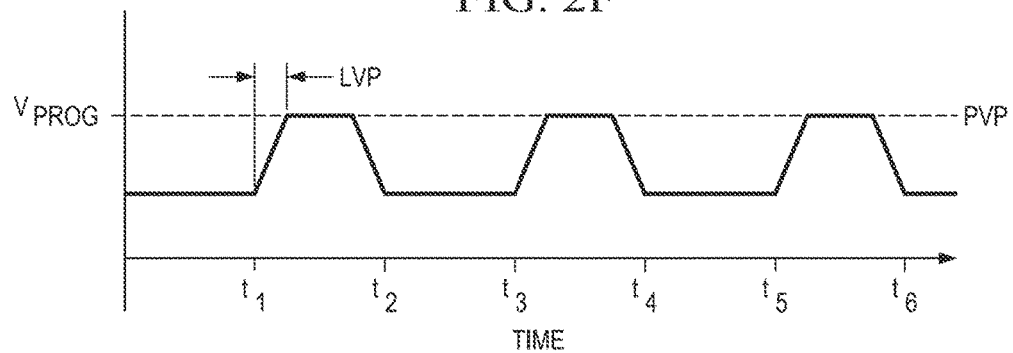
Figure 2G:
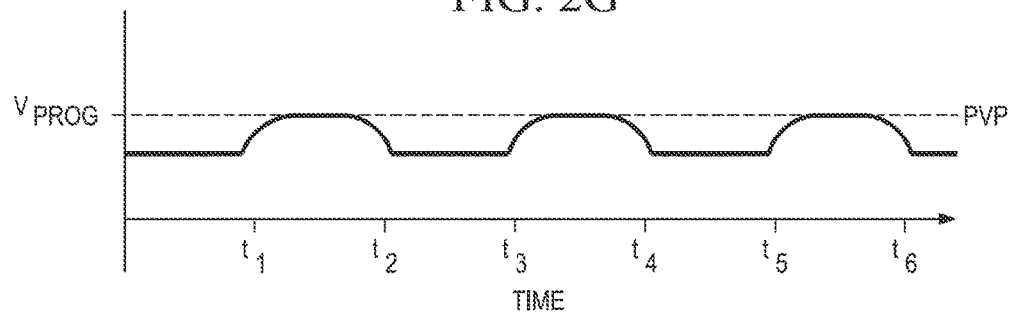
Figure 2H:
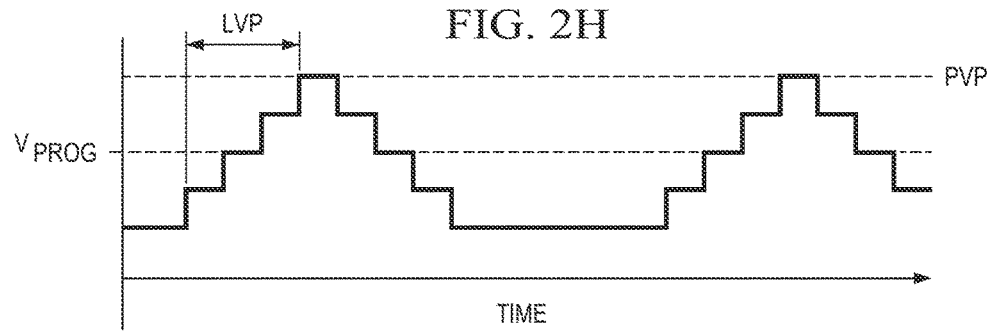
Figure 2I:
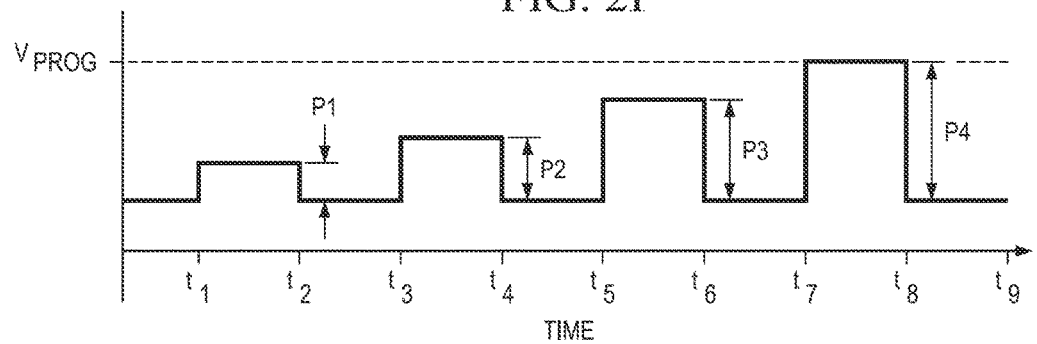
Figure 2J:
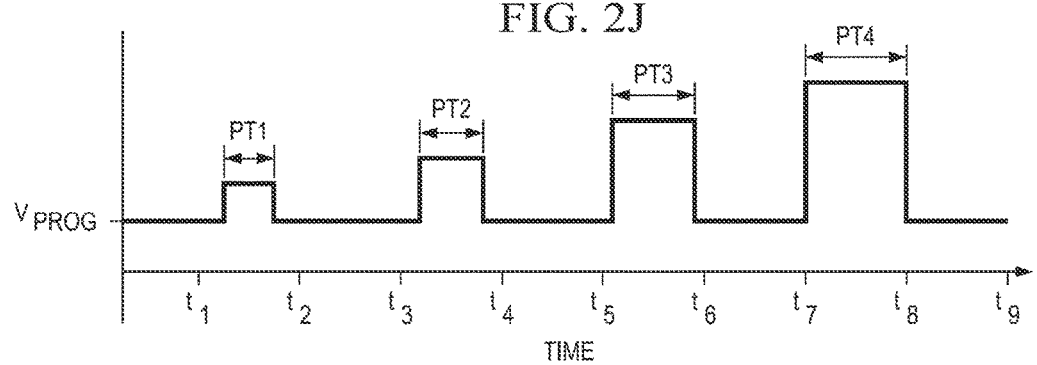
Figure 2K:
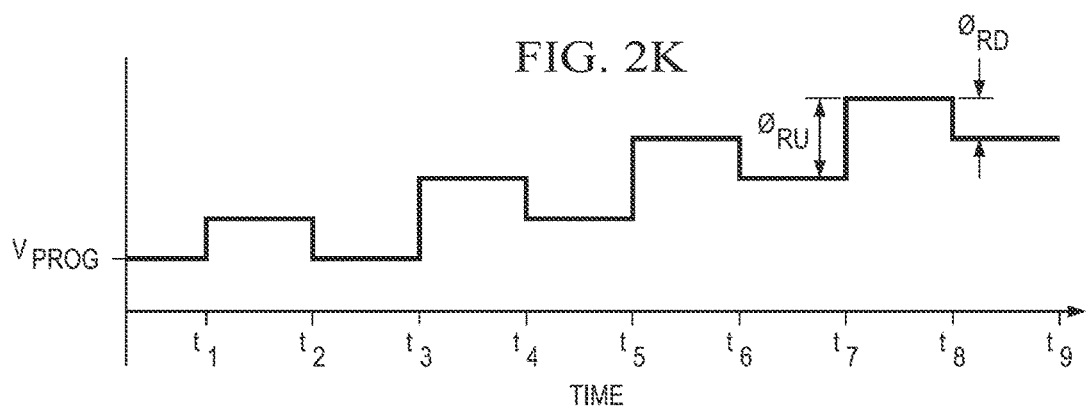
Figure 2L:
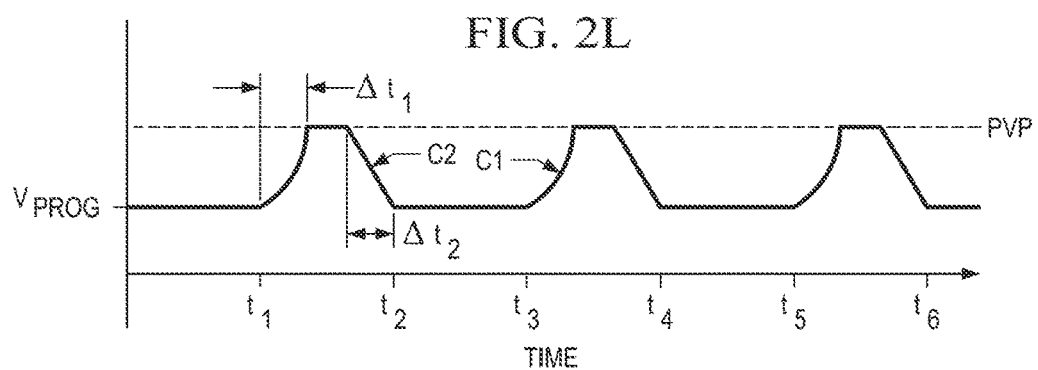
Figure 2M:
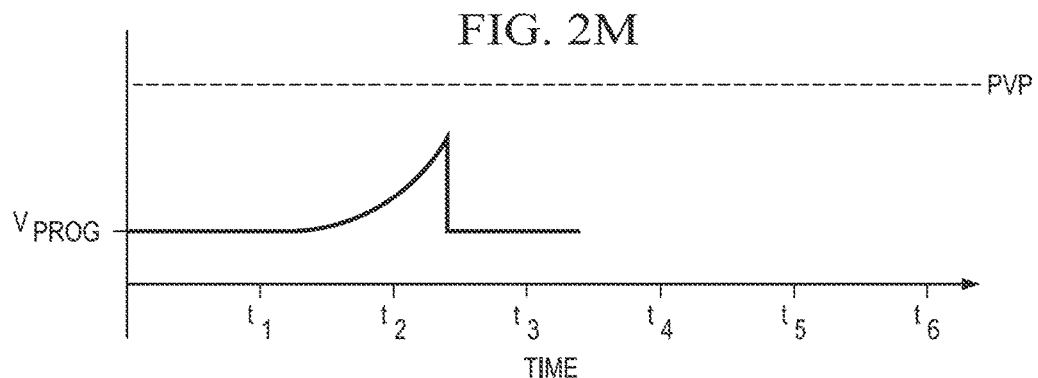
Figure 2N:
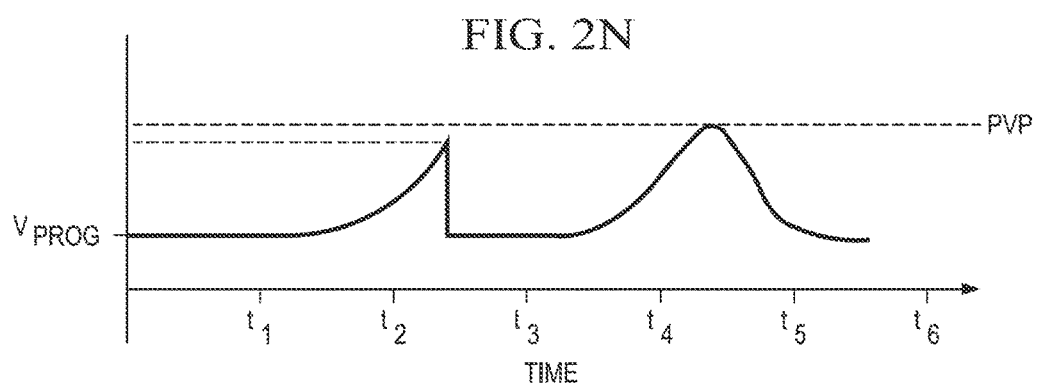

FIG. 2, which includes FIGS. 2A-2N, illustrates timing diagrams highlighting the programming pulse applied to a memory unit in accordance with embodiments of the invention.

FIG. 2A illustrates a timing diagram showing a ramped up voltage pulse applied between the first and the second nodes of the memory unit in accordance with an embodiment of the invention.

In accordance with an embodiment of the invention, the potential difference across the first and the second nodes 1 and 2 is increased to a peak voltage, which may be the same as the conventional square pulse. Thus, the first node 1 is at a higher (positive) potential than the second node 2 due to the applied pulse.

However, as illustrated, the voltage is not abruptly increased as in conventional programming. Rather, the program voltage ($V_{PROG}$) is slowly ramped up to a peak programming voltage PPV. As illustrated in FIG. 2A, the ramp up voltage follows a parabolic rate in one embodiment. In the illustrated embodiment of FIG. 2A, the programming pulse is abruptly ramped down from the peak programming voltage PPV.

The programming pulse may have a peak programming voltage PPV of at least 500 mV in various embodiments. In one or more embodiments, the peak programming voltage PPV is at least 1 V. In one or more embodiments, the peak programming voltage PPV is about 750 mV to about 1000 mV. In one or more embodiments, the peak programming voltage PPV is about 1 V to about 1.5 V. In one or more embodiments, the peak programming voltage PPV is about 1.5 V to about 2 V. In one or more embodiments, the peak programming voltage PPV is about 2 V to about 2.5 V.

The programming pulse may have a program pulse width $t_{PW}$ of at least 0.1 µs in various embodiments. In one or more embodiments, the program pulse width $t_{PW}$ is at least 1 µs. In one or more embodiments, the program pulse width $t_{PW}$ is about 1 µs to about 10 µs. In one or more embodiments, the program pulse width $t_{PW}$ is about 2.5 µs to about 7.5 µs. In one or more embodiments, the program pulse width $t_{PW}$ is about 5 µs to about 15 µs.

In various embodiments, the programming voltage comprises an initial portion over which the potential is slowly increased. In various embodiments, the programming voltage may be increased at a rate lower than about 100 mV/µs. In particular, the ramp-up profile has a first portion, which is a low voltage phase LVP and a second portion at a higher voltage. As will be described in detail with respect to FIG. 3, gradually increasing the voltage has many advantages over conventional abrupt programming.

In various embodiments, the ramp-up profile of the programming pulse may be modified to any suitable profile. In particular, the low voltage phase LVP may be modified to increase or decrease the ramp rate depending on the programming characteristic of the memory unit. In various embodiments, a ratio of the time period of the first portion ($t_{LVP}$) is at least 10% of the total pulse width $t_{PW}$. In various embodiments, a ratio of the time period of the first portion ($t_{LVP}$) is at least 50% of the total pulse width $t_{PW}$. In various embodiments, a ratio of the time period of the first portion ($t_{LVP}$) is between about 10% to about 50% of the total pulse width $t_{PW}$. In various embodiments, a ratio of the time period of the first portion ($t_{LVP}$) is between about 50% to about 100% of the total pulse width $t_{PW}$. Examples of such modifications will be described using FIGS. 2B-2L in accordance with various embodiments of the invention.

FIG. 2B illustrates an embodiment of the invention including an exponential ramp-up profile applied between the first and the second nodes of the memory unit (e.g. FIG. 1B). As illustrated in FIG. 2B, the exponential is a slow exponential in one or more embodiments such that the programming voltage is about or below half the peak programming voltage PPV at about half the width of the programming pulse $t_{PW}$. As only an illustration, the programming voltage (PV) during the first portion (low voltage phase LVP) may follow an exponential such as PV(t)=(PVP×exp(t/(rate×$t_{PW}$))−1), where PVP is the peak programming voltage, t is the time, $t_{PW}$ is the width of the pulse. The rate may be varied and may be about 1.5 to about 50 in various embodiments, and may be about 1.5 to about 3 in one embodiment.

In an alternative embodiment, the program pulse may comprise a first portion having an exponential ramp, a second portion having a flat or constant voltage, and a third portion with an abrupt ramp-down. In one or more embodiments, the programming voltage reaches the peak programming voltage PPV at about half (or less) the width of the programming pulse $t_{PW}$. As only an illustration, the programming voltage (PV) during the first portion (low voltage phase LVP) may follow an exponential such as PV(t)=(PVP×exp(t/(rate×$t_{PW}$))−1), where PVP is the peak programming voltage, t is the time, $t_{PW}$ is the width of the pulse. The rate may be varied and may be about 0.1 to about 1.5 in various embodiments, and may be about 0.5 to about 1 in one embodiment.

FIG. 2C illustrates a saw tooth programming pulse applied between the first and the second nodes of the memory unit in accordance with another embodiment. In accordance with an embodiment, the low voltage phase LVP comprises a linear portion during which the programming voltage increases linearly. In one embodiment, the programming voltage increases linearly as PV(t)=(PVP×t/$t_{PW}$), where PVP is the peak programming voltage, t is the time, $t_{PW}$ is the width of the pulse. In another embodiment, the programming voltage increases linearly as PV(t)=(PVP×t/($t_{PW}$−$t_0$)), where $t_0$ may be about 0.5 $t_{PW}$ to about $t_{PW}$.

FIG. 2D illustrates a triangular programming pulse applied between the first and the second nodes of the memory unit in accordance with another embodiment. As in the prior embodiment, the programming voltage increases linearly during the low voltage phase LVP. However, after reaching a peak programming voltage PVP, the program voltage linearly decreases back.

FIG. 2E illustrates an alternative embodiment wherein the program pulse comprises a first portion comprising an exponential ramp-up, a second portion at a peak program voltage, and a third portion comprising an exponential ramp-down. The exponential may be as described in prior embodiments.

FIG. 2F illustrates an alternative embodiment wherein the program pulse comprises a first portion comprising a linear ramp-up, a second portion at a peak program voltage, and a third portion comprising an linear ramp-down.

FIG. 2G illustrates an alternative embodiment wherein the program pulse comprises a first portion comprising a parabolic ramp-up, a second portion at a peak program voltage, and a third portion comprising a parabolic ramp-down.

Embodiments of the invention may also include other types of programming pulse. For example, FIG. 2H illustrates a programming pulse formed by the superposition of a plurality of square pulses. Using such an embodiment, complexity arising from the need for generating exponential ramp-ups or ramp-down may be avoided.

FIG. 2I illustrates embodiments of the invention highlighting a different superposition of a plurality of pulses. In FIG. 2I, a first program pulse wave having a first peak voltage P1, a second program pulse wave having a second peak voltage P2, and a third program pulse wave having a third voltage P3 and a fourth program pulse wave having a fourth voltage P4 may be sequentially asserted. As a consequence, the programming of the memory unit is performed by pulses having incrementally higher peak potential.

FIG. 2J illustrates embodiments of the invention highlighting a different superposition of a plurality of pulses than FIGS. 2I and 2H. In FIG. 2I, a first program pulse wave having a first pulse width PT1, a second program pulse wave having a second pulse width PT2, a third program pulse wave having a third pulse width PT3, and a fourth program pulse wave having a fourth pulse width PT4 may be sequentially used. As a consequence, the programming of the memory unit is performed by pulses having incrementally longer pulses and perhaps incrementally higher peak potential.

FIG. 2K illustrates embodiments of the invention highlighting a different superposition of a plurality of pulses. In contrast, the prior embodiment of FIG. 2J, the ramp-up potential $\phi_{RU}$ is more than the subsequent ramp-down potential $\phi_{RD}$ thereby creating an asymmetrical pulse.

Embodiments of the invention may include combinations of the above programming pulses. For example, in one embodiment, as illustrated in FIG. 2L, the programming pulse may comprise a first portion comprising an exponential ramp-up (first program curve C1), a second portion at a peak program voltage PPV, and a third portion comprising a linear ramp-down (second program curve C2). Embodiments of the invention may similarly include a parabolic ramp-down in another embodiment. The ramp-up program time $\Delta t1$ may not be the same as the ramp-down program time $\Delta t2$ in various embodiments, i.e., the program pulse may be asymmetrical.

In various embodiments, the ramp-up program time $\Delta t1$ is at least 10% of the total pulse width $t_{PW}$. In various embodiments, the ramp-up program time $\Delta t1$ is at least 50% of the total pulse width $t_{PW}$. In various embodiments, the ramp-up program time $\Delta t1$ is between about 10% to about 50% of the total pulse width $t_{PW}$. In various embodiments, the ramp-up program time $\Delta t1$ is about 50% to about 100% of the total pulse width $t_{PW}$.

In various embodiments, the ramp-down program time $\Delta t2$ is at least 10% of the total pulse width $t_{PW}$. In various embodiments, the ramp-down program time $\Delta t2$ is at least 50% of the total pulse width $t_{PW}$. In various embodiments, the ramp-down program time $\Delta t2$ is between about 10% to about 50% of the total pulse width $t_{PW}$. In various embodiments, the ramp-down program time $\Delta t2$ is about 50% to about 100% of the total pulse width $t_{PW}$.

FIG. 2M illustrates an alternative embodiment of the application of ramps to the memory cell.

In this embodiment, unlike the prior embodiments, a ramp is applied without an end time. Therefore, the end of voltage ramp may not be timed, but may be based on detecting a state change in the cell, for example, due to the reaching of a target conductance level. This target conductance level may be predetermined or dynamically determined during operation, for example, based on temperature and other factors. A write circuit may be used to measure this conductance during the applied ramp pulse. Once this target conductance level is achieved, the voltage ramp may be stopped. This target voltage may be much lower than a peak program voltage (PVP). Such an embodiment advantageously eliminates over-programming and/or over-erase (when applied during erasure). Embodiments of the invention using such a technique may enable multi-cell operation because multiple conductance levels may be targeted.

FIG. 2N illustrates an alternative embodiment of the application of ramps to the memory cell.

Unlike the prior embodiments, in this embodiment, a first pulse having a first ramp profile is applied. After applying the first pulse, the state of the resistive device may be measured. If the state of the resistive device does not change, a different ramp may be applied, for example, a ramp with a higher voltage or a higher ramp rate (slope). Thus, subsequent pulses may be different from each other. In various embodiments, any characteristic of the ramp profile may be the varying parameter. For example, in one embodiment, the pulse width may be varied between subsequent pulse while keeping the rest of the profile similar. In another embodiment, the ramp slope or ramp rate may be varied while keeping the maximum voltage and the pulse width constant between subsequent pulses. In yet another embodiment, the maximum voltage may be changed. In one or more embodiments, all of the above may be varied.

FIG. 3, which includes FIGS. 3A-3I, illustrates timing diagram of an erase operation highlighting the erase pulses in accordance with embodiments of the invention.

FIGS. 3A-3I illustrate timing diagrams showing a ramped voltage erase pulse applied between the first and the second nodes of the memory unit in accordance with an embodiment of the invention. In accordance with an embodiment of the invention, the potential difference across the first and the second nodes 1 and 2 is lowered to a peak voltage. Thus, similar to FIG. 1C, the first node 1 is at a lower (negative) potential than the second node 2 due to the applied pulse.

Figure 3A:
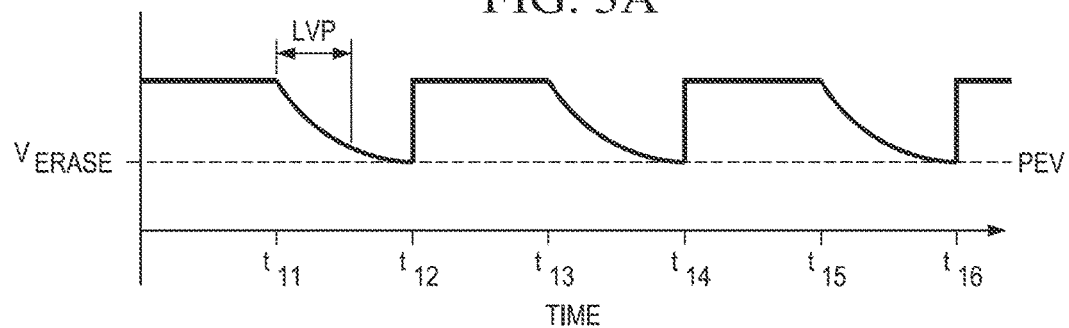
FIGS. 3A-3I, illustrates timing diagrams of erase operations highlighting the erase pulses in accordance with embodiments of the invention.

However, as illustrated in various embodiments, the erase voltage is not abruptly increased as in conventional erasing. Rather, the erase voltage ($V_{ERASE}$) is slowly ramped to a peak erase voltage PEV. As illustrated in FIG. 3A, the ramp-down voltage follows a parabolic rate in one embodiment. In the illustrated embodiment of FIG. 3A, the erase pulse is abruptly ramped up from the peak erase voltage PEV.

The erase pulse may have a peak erase voltage PEV of at least −200 mV in various embodiments. In one or more embodiments, the peak erase voltage PEV is at least −1 V. In one or more embodiments, the peak erase voltage PEV is about −750 mV to about −1 V. In one or more embodiments, the peak erase voltage PEV is about −1 V to about −1.5 V. In one or more embodiments, the peak erase voltage PEV is about −1.5 V to about −2 V. In one or more embodiments, the peak erase voltage PEV is about −2 V to about −3 V.

The erase pulse may have a pulse width of at least 0.1 μs in various embodiments. In one or more embodiments, the pulse width of at least 1 μs. In one or more embodiments, the pulse width is about 1 μs to about 10 μs. In one or more embodiments, the pulse width is about 2.5 μs to about 7.5 μs. In one or more embodiments, the pulse width is about 5 μs to about 15 μs.

In various embodiments, the erase voltage comprises an initial portion over which the potential is slowly decreased. In various embodiments, the erase voltage may be decreased at a rate lower than about −100 mV/μs. In particular, the ramp down profile has a first portion, which is a low voltage phase LVP and a second portion at a higher negative voltage. As will be described in detail with respect to FIG. 9, slowly decreasing the voltage has many advantages over conventional abrupt erasing.

In various embodiments, the ramp-down profile of the erase pulse may be modified to any suitable profile. In particular, the low voltage phase LVP may be modified to increase or decrease the ramp rate depending on the programming/erasing characteristic of the memory unit. In various embodiments, a ratio of the time period of the first portion ($t_{LVP}$) is at least 10% of the total pulse width $t_{PW}$. In various embodiments, a ratio of the time period of the first portion ($t_{LVP}$) is at least 50% of the total pulse width $t_{PW}$. In various embodiments, a ratio of the time period of the first portion ($t_{LVP}$) is between about 10% to about 50% of the total pulse width $t_{PW}$. In various embodiments, a ratio of the time period of the first portion ($t_{LVP}$) is between about 50% to about 100% of the total pulse width $t_{PW}$. Examples of such modifications will be described using FIGS. 3B-3H in accordance with various embodiments of the invention.

Figure 3B:
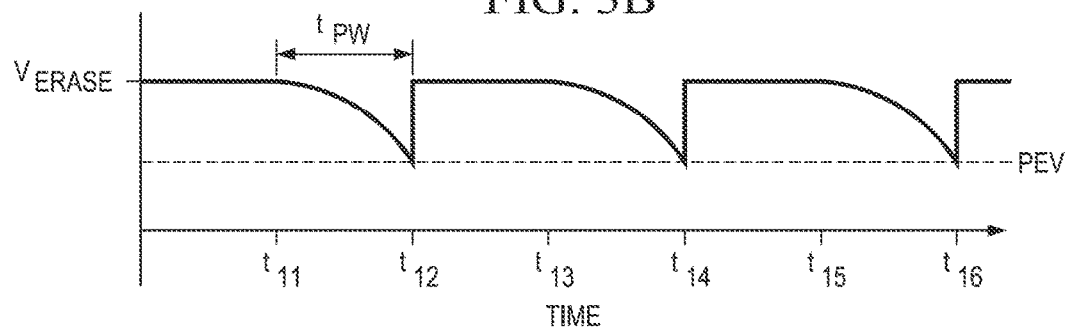

FIG. 3B illustrates an embodiment of the invention including an exponential ramp-down profile applied between the first and the second nodes of the memory unit. As illustrated in FIG. 3B, the exponential is a slow exponential in one or more embodiments such that the erase voltage is about or above half the peak erase voltage PEV at about half the width of the erase pulse $t_{PW}$. As only an illustration, the erase voltage (EV) during the first portion (low voltage phase LVP) may follow an exponential such as $EV(t)=(PEV \times \exp(t/(rate \times t_{PW}))-1)$, where PEV is the peak erase voltage, t is the time, $t_{PW}$ is the width of the pulse. The rate may be varied and may be about 1.5 to about 50 in various embodiments, and may be about 1.5 to about 3 in one embodiment.

In an alternative embodiment, the erase pulse may comprise a first portion having an exponential dependence, a second portion having a flat or constant voltage, and a third portion with an abrupt ramp-up. In one or more embodiments the erase voltage reaches the peak erase voltage PEV at about half or less the width of the erase pulse $t_{PW}$. As only an illustration, the peak erase voltage (PEV) during the first portion (low voltage phase LVP) may follow an exponential such as $EV(t)=(PEV \times \exp(-t/(rate \times t_{PW}))-1)$, where PEV is the peak erase voltage, t is the time, $t_{PW}$ is the width of the pulse. The rate may be varied and may be about 0.1 to about 1.5 in various embodiments, and may be about 0.5 to about 1 in one embodiment.

Figure 3C:
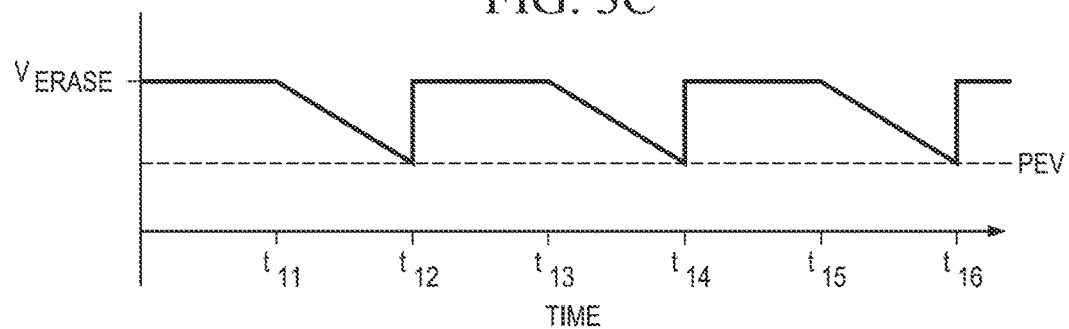

FIG. 3C illustrates a saw tooth programming pulse applied between the first and the second nodes of the memory unit in accordance with another embodiment. In accordance with an embodiment, the low voltage phase LVP comprises a linear portion during which the erase voltage decreases linearly. In one embodiment, the erase voltage increases linearly as $EV(t)=(PEV \times t/t_{PW})$, where PEV is the peak erase voltage, t is the time, $t_{PW}$ is the width of the pulse. In another embodiment, the erase voltage decreases linearly as $EV(t)=(PEV \times t/(t_{PW}-t_0))$, where $t_0$ may be about 0.5 $t_{PW}$ to about $t_{PW}$.

Figure 3D:
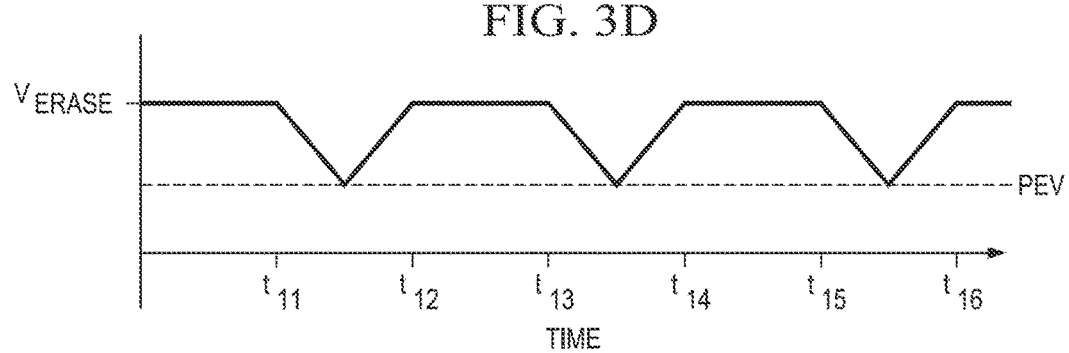

FIG. 3D illustrates a triangular erase pulse applied between the first and the second nodes of the memory unit in accordance with another embodiment. As in the prior embodiment, the erase voltage decreases linearly during the low voltage phase LVP. However, after reaching a peak erase voltage PEV, the erase voltage linearly increases back.

Figure 3E:
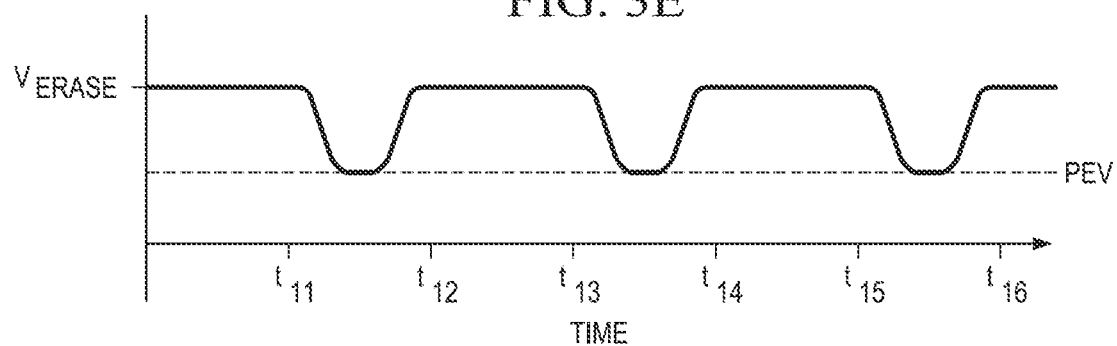

FIG. 3E illustrates an alternative embodiment wherein the erase pulse comprises a first portion comprising an exponential (alternately parabolic) ramp-down, a second portion at a peak erase voltage, and a third portion comprising an exponential (alternately parabolic) ramp-up.

Figure 3F:
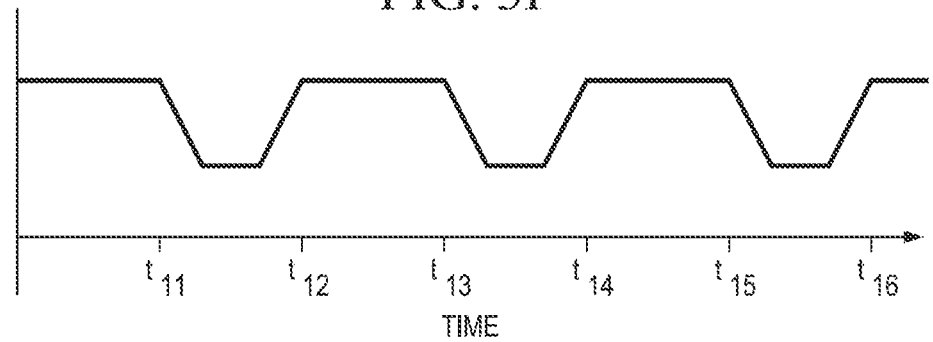

FIG. 3F illustrates an alternative embodiment wherein the program pulse comprises a first portion comprising a linear ramp-down, a second portion at a peak erase voltage, and a third portion comprising an linear ramp-up.

Figure 3G:
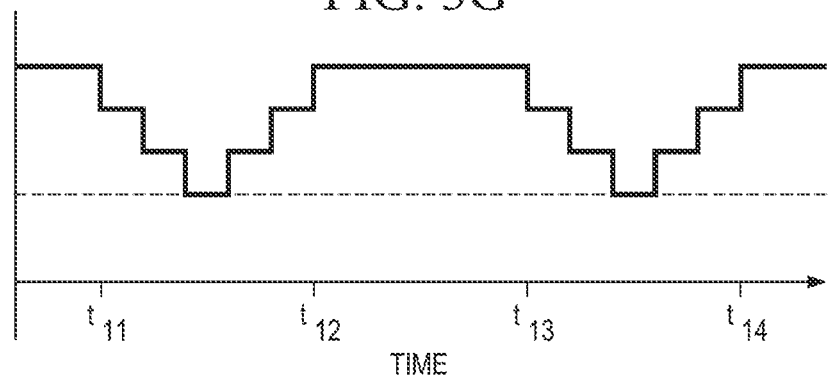

Embodiments of the invention may also include other types of erase pulses. For example, FIG. 3G illustrates a programming pulse formed by the superposition of a plurality of square pulses. Using such an embodiment, circuit complexity arising from the need for exponential ramp-ups or ramp-down may be avoided.

Figure 3H:
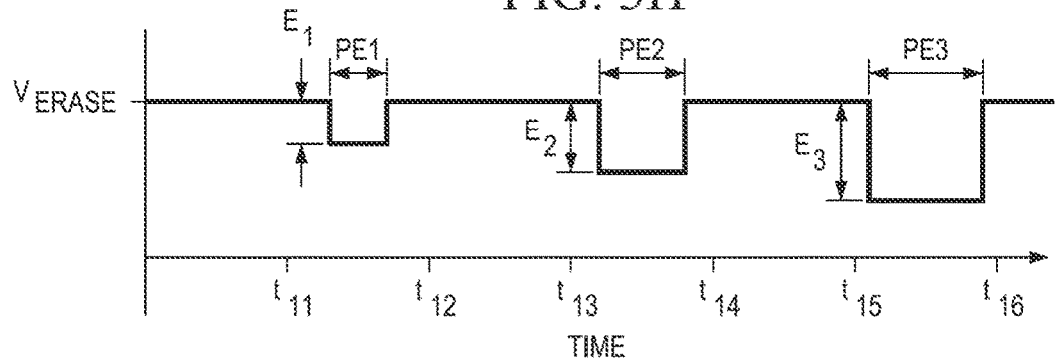

FIG. 3H illustrates embodiments of the invention highlighting a different superposition of a plurality of pulses. In FIG. 3H, a first erase pulse wave having a first peak erase voltage E1 and a first pulse width PE1, a second erase pulse wave having a second erase peak voltage E2 and a second pulse width PE2, a third erase pulse wave having a third erase voltage E3 and a third pulse width PE3, and a fourth erase pulse wave having a fourth erase voltage E4 and a fourth pulse width PE4 may be used sequentially for the erasing process. The pulse voltage and pulse widths of each of these waves may also be different and may be increased with each subsequent pulse. As a consequence, the erasing of the memory unit is performed by pulses having incrementally lower peak potential and incrementally longer pulses. In a different embodiment, the asymmetric ramp-up and ramp-down as illustrated in FIG. 2K may be incorporated.

Figure 3I:
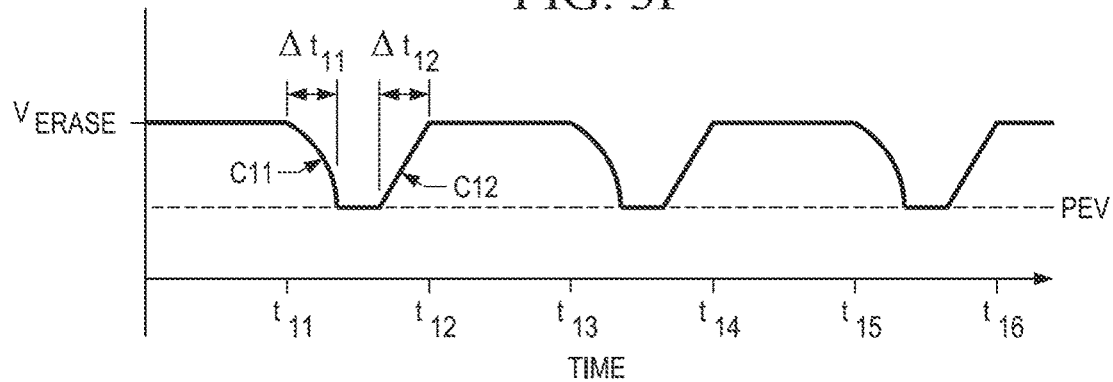

Embodiments of the invention may include combinations of the above erase pulses. For example, in one embodiment, as illustrated in FIG. 3I, the erase pulse may comprise a first portion comprising an exponential ramp-down (first erase curve C11), a second portion at a peak erase voltage PEV, and a third portion comprising a linear ramp-up (second erase curve C12). Embodiments of the invention may similarly include a parabolic or exponential ramp-up in another embodiment. The ramp-down erase time Δt11 may not be the same as the ramp-up erase time Δt12 in various embodiments, i.e., the program pulse may be asymmetrical.

In various embodiments, the ramp-up erase time Δt11 is at least 10% of the total pulse width $t_{PW}$. In various embodiments, the ramp-up erase time Δt11 is at least 50% of the total pulse width $t_{PW}$. In various embodiments, the ramp-up erase time Δt11 is between about 10% to about 50% of the total pulse width $t_{PW}$. In various embodiments, the ramp-up erase time Δt11 is about 50% to about 100% of the total pulse width $t_{PW}$.

In various embodiments, the ramp-down erase time Δt12 is at least 10% of the total pulse width $t_{PW}$. In various embodiments, the ramp-down erase time Δt12 is at least 50% of the total pulse width $t_{PW}$. In various embodiments, the ramp-down erase time Δt12 is between about 10% to about 50% of the total pulse width $t_{PW}$. In various embodiments, the ramp-down erase time Δt12 is about 50% to about 100% of the total pulse width $t_{PW}$.

Embodiments of the erase pulse include the additional embodiments illustrated in FIG. 2, which have not been reproduced for brevity. For example, the ramp of the erase pulse may be applied with without an end time. As described previously, the end of voltage ramp may be based determined based on detecting a state change in the cell, for example, due to the reaching of a target conductance level. Similarly, in various embodiments, subsequent pulses may be different and may be dynamically changed as described using FIG. 2N.

Figure 4A:
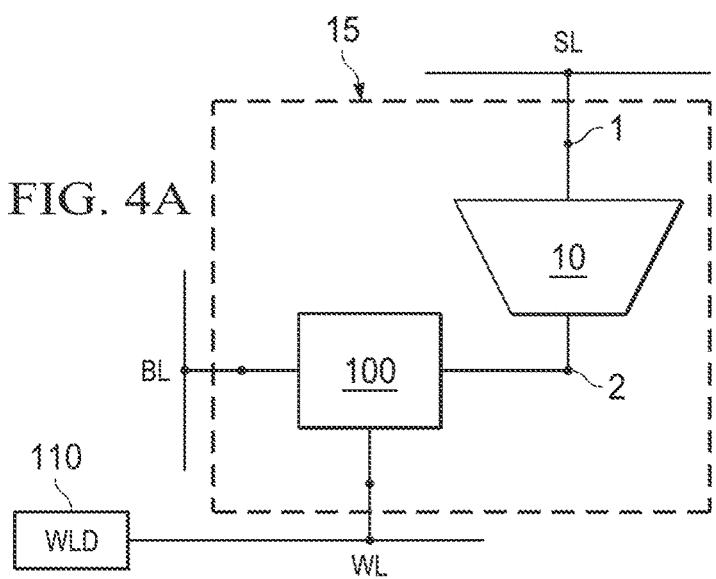

FIG. 4, which includes FIGS. 4A-4B, illustrates a memory cell in accordance with embodiments of the invention.

The memory cell 15 may be a one access device and one memory unit (1-AD 1-MU) memory cell in one embodiment. The memory cell 15 may be connected through word lines WL, bit lines BL, and select lines SL to plurality of similar memory cells thereby forming a memory array. A memory cell 15 comprises the memory unit 10 described in various embodiments of the present application. The memory unit 10 may comprise resistive switching memories that switch based on thermal, electrical, and/or electromagnetic effects.

The memory unit 10 may comprise an ionic memory in one or more embodiments. Such ionic memory may involve cells based on anion migration or cation migration. An example of an ionic memory includes a conductive bridging random access memory. The CBRAM may comprise a solid electrolyte layer sandwiched between an inert electrode and an electro-chemically active electrode. The solid electrolyte layer may comprise a chalcogenide material such as a germanium based chalcogenide such as $GeS_2$. In various embodiments, the solid electrolyte layer may comprise copper doped $WO_3$, $Cu/Cu_2S$, $Cu/Ta_2O_5$, $Cu/SiO_2$, $Ag/Zn_xCd_{1-x}S$, $Cu/Zn_xCd_{1-x}S$, $Zn/Zn_xCd_{1-x}S$, GeTe, GST, As—S, $Zn_xCd_{1-x}S$, $TiO_2$, $ZrO_2$, $SiO_2$. In some embodiments, the solid electrolyte 60 may comprise a plurality of layers and may include bilayers such as $Ge_xSe_y/SiO_x$, $Ge_xSe_y/Ta_2O_5$, $Cu_xS/Cu_xO$, $Cu_xS/SiO_2$ and combinations thereof. The electro-chemically active electrode may comprise silver, copper, zinc, and/or copper-tellurium in various embodiments.

In another embodiment, the memory unit 10 may comprise a RRAM, e.g., based on metal oxides in some embodiments. The memory unit 10 may comprise a phase change memory unit in alternative embodiments.

Referring to FIG. 4A, the memory unit 10 is disposed between a first node 1 (e.g., anode) and a second node 2 (e.g., cathode). The first node 1 is coupled to the select line SL while the second node 2 is coupled to a bit line BL through an access device 100.

In various embodiments, the access device 100 may comprise a switching device. In one embodiment, the access device 100 is a diode. In an alternate embodiment, the access device 100 is a transistor. The access device 100 may provide a conductive path from the second node 2 to the bit line BL. The access device 100 may be enabled or controlled using the word line WL (as well as the bit line BL and the select line SL). The word line WL may be coupled to a word line driver (WLD) 110, which may be commonly shared with a plurality of memory cells sharing a common word line WL. As will be described, the WLD 110 may drive the word line using one or more of the ramp profiles described in various embodiments.

Similarly, the bit line BL may be coupled or driven by a bit line driver BLD 120 and the select line SL may be coupled to a select line driver SLD 130. The BLD 120 and the SLD 130 may be commonly shared over a plurality of memory cells sharing a common bit line or a common select line. As will be described, the BLD 120 and/or the SLD 130 may drive the bit line and select line respectively using one or more of the ramp profiles described in various embodiments.

FIG. 4B illustrates a memory cell comprising a transistor and a memory unit in accordance with an embodiment of the invention.

In this embodiment, the access device 100 is a transistor. The transistor may be a metal insulator field effect transistor in one embodiment. In other embodiments, the transistor may be other types of transistors including bipolar transistors. The memory cell 15 may be a one transistor and one memory unit (1-T 1-MU) memory cell in one embodiment. As illustrated in FIG. 4B, the gate of the access device 100 is coupled to a word line WL. A first source/drain node of the access device 100 is coupled to a bit line BL while a second source/drain node of the access device 100 is coupled to the memory unit through the second node 2. Thus, the memory unit 10 is coupled to the bit line BL through a channel region of the access device 100.

As will be described in FIGS. 5-7, the embodiments of the invention described above with respect to FIGS. 2-3 may be implemented to a memory cell by applying ramped pulses to one or more nodes of the memory cell.

FIG. 5, which includes FIGS. 5A-5L, illustrates timing diagrams of program operations highlighting the program pulses asserted at a word line in accordance with embodiments of the invention.

The program pulses illustrated in FIG. 5 may be applied to the memory cells described in FIG. 4. During the programming of the memory unit 10, the bit line BL may be grounded while the select line is pulled up to a positive potential. Alternatively, in some embodiments, the select line SL may be grounded and the bit line BL may be pulled down to a negative potential. The word line WL of the access device 100 is enabled to turn-on the access device 100, which eventually turns on (pushes to the low resistance state) the memory unit 10. For example, for enabling an access device comprising an n-channel field effect transistor, a positive bias is applied on the word line WL.

The voltage on the select line $V_{SL}$ and the voltage on the word line $V_{WL}$ for a pulse in a series of pulses are illustrated in FIG. 5. Although in various embodiments a plurality of pulses may be used for the program and erase operations, FIG. 5 illustrates a single pulse for clarity. The embodiments described in FIG. 5 may apply the various embodiments described in FIG. 2.

A conventional programming pulse is illustrated in FIG. 5A. As shown in FIG. 5A, the select line SL and the word line WL are pulled up, for example, to a program voltage $V_{PROG}$. As described previously, in conventional programming, the program voltage $V_{PROG}$ is ramped abruptly (near infinite slope) and the word line WL and the select line SL may be asserted at the same time.

FIGS. 5B-5L illustrate various applications of the embodiments of the invention described previously with respect to FIG. 2.

Referring to FIG. 5B, in one embodiment, a square pulse may be asserted on the select line while a ramped pulse is asserted on the word line. The ramp up voltage of the word line $V_{WL}$ follows a parabolic rate in one embodiment. After reaching a peak program voltage PPV, the voltage of the word line $V_{WL}$ is abruptly ramped down.

In various embodiments, the voltage of the word line $V_{WL}$ comprises an initial portion over which the potential is slowly increased. In various embodiments, the voltage of the word line $V_{WL}$ may be increased at a rate lower than about 100 mV/μs. In particular, the ramp up profile has a first portion, which is a low voltage phase LVP and a second portion at a higher voltage. Thus, the ramping the word line WL, modulates the current flowing through the access device and thereby the memory unit.

In various embodiments, the ramp-up profile of the programming pulse may be modified to any suitable profile. In particular, the low voltage phase LVP may be modified to increase or decrease the ramp rate depending on the programming characteristic of the memory unit.

Figure 5C:
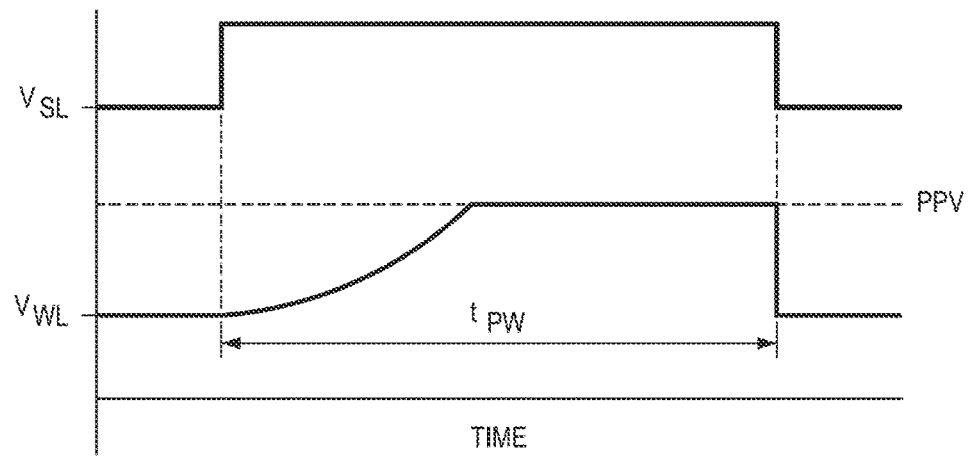

FIG. 5C illustrates an embodiment of the invention including an exponential ramp up profile asserted on the word line of the memory cell.

In one embodiment, the voltage of the word line $V_{WL}$ may comprise a first portion having an exponential dependence, a second portion having a flat or constant voltage, and a third portion with an abrupt ramp-down. In one or more embodiments the voltage of the word line $V_{WL}$ reaches the peak programming voltage PPV at about half (or less) the width of the programming pulse $t_{PW}$. In an alternative embodiment, the exponential is a slow exponential such that the programming voltage is about or below half the peak programming voltage PPV at about half the width of the programming pulse $t_{PW}$. As only an illustration, the voltage of the word line $V_{WL}$ during the first portion (low voltage phase LVP) may follow an exponential such as $V_{WL}(t)=$ (PVP×exp(t/(rate×$t_{PW}$))−1), where PVP is the peak programming voltage, t is the time, $t_{PW}$ is the width of the pulse. The rate may be varied and may be about 1.5 to about 50 in various embodiments, and may be about 1.5 to about 3 in one embodiment. In another embodiment, the rate may be about 0.1 to about 1.5, and may be about 0.5 to about 1 in one embodiment.

Figure 5D:
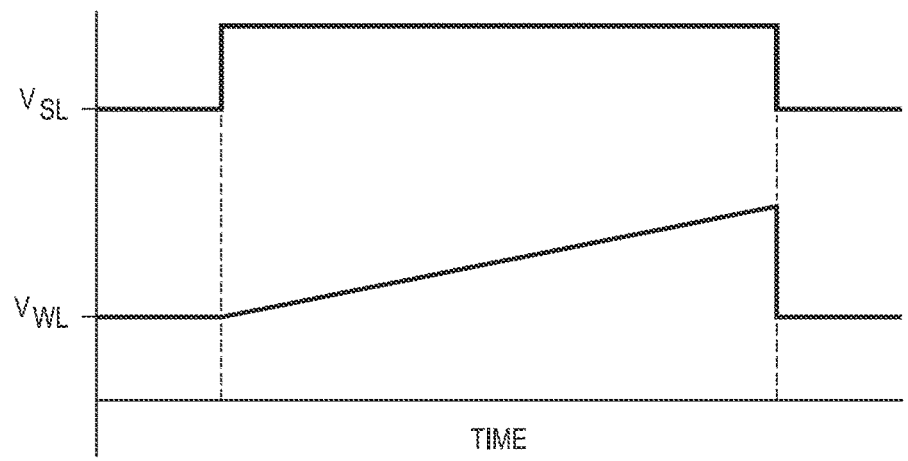

FIG. 5D illustrates a saw tooth pulse voltage applied on the word line WL of the memory cell in accordance with another embodiment. In accordance with an embodiment, the low voltage phase LVP comprises a linear portion during which the voltage of the word line $V_{WL}$ increases linearly. In one embodiment, the voltage of the word line $V_{WL}$ increases linearly as $V_{WL}(t)=(PVP \times t/t_{PW})$, where PVP is the peak programming voltage, t is the time, $t_{PW}$ is the width of the pulse. In another embodiment, the voltage of the word line $V_{WL}$ increases linearly as $V_{WL}(t)=(PVP \times t/(t_{PW}-t_0))$, where $t_0$ is about 0.5 $t_{PW}$ to about $t_{PW}$.

Figure 5E:
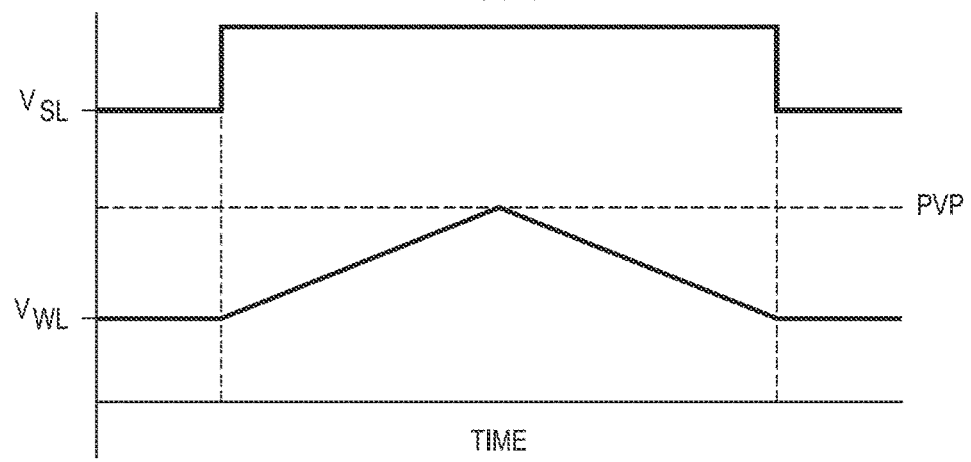

FIG. 5E illustrates a triangular programming pulse asserted on the word line WL of the memory cell in accordance with another embodiment. As in the prior embodiment, the voltage of the word line $V_{WL}$ increases linearly during the low voltage phase LVP. However, after reaching a peak programming voltage PVP, the voltage of the word line $V_{WL}$ linearly decreases back.

Figure 5F:
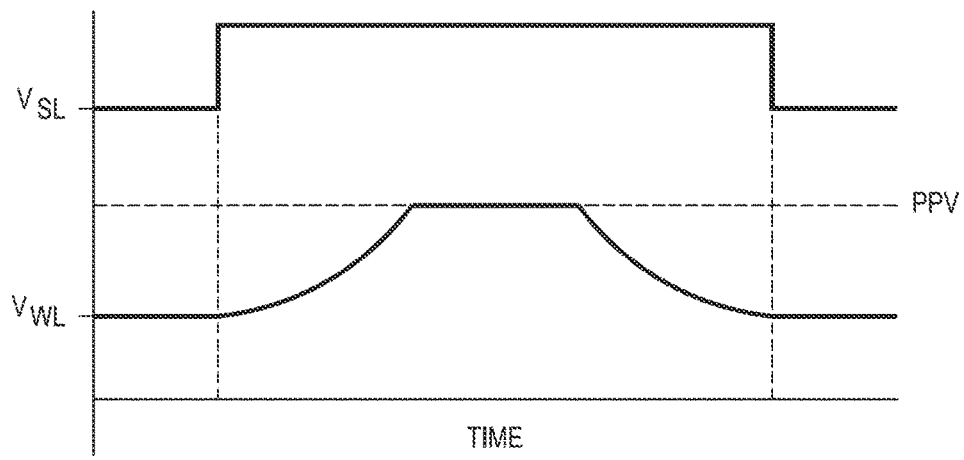

FIG. 5F illustrates an alternative embodiment wherein the voltage of the word line $V_{WL}$ comprises a first portion comprising an exponential ramp-up, a second portion at a peak program voltage PPV, and a third portion comprising an exponential ramp-down.

Figure 5G:
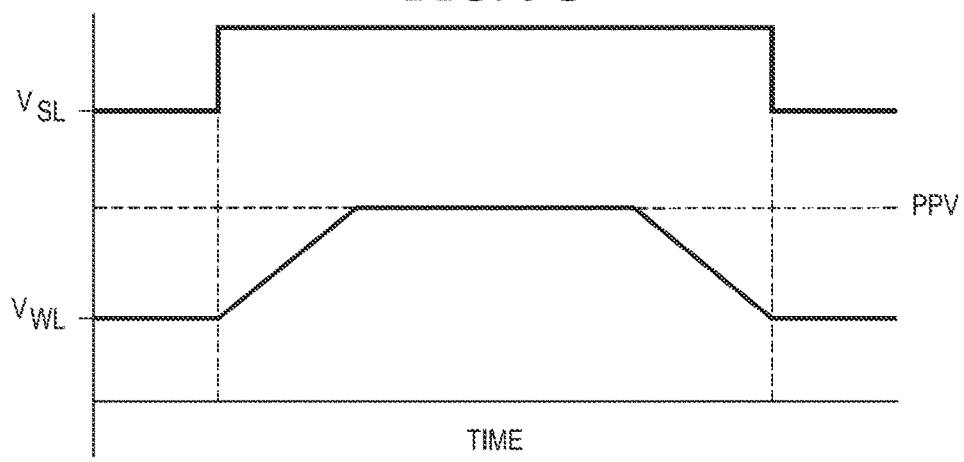

FIG. 5G illustrates an alternative embodiment wherein the voltage of the word line $V_{WL}$ comprises a first portion comprising a linear ramp-up, a second portion at a peak program voltage, and a third portion comprising an linear ramp-down.

Figure 5H:
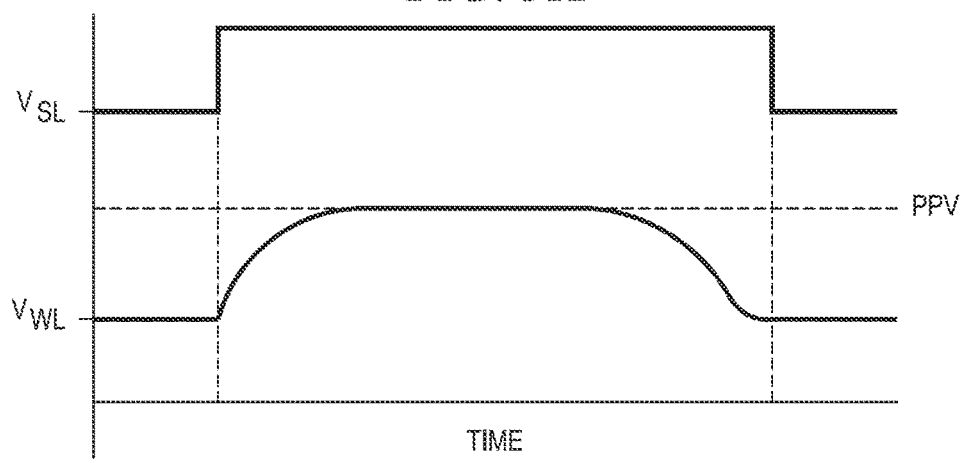

FIG. 5H illustrates an alternative embodiment wherein the voltage of the word line $V_{WL}$ comprises a first portion comprising a parabolic ramp-up, a second portion at a peak program voltage, and a third portion comprising an parabolic ramp-down.

Figure 5I:
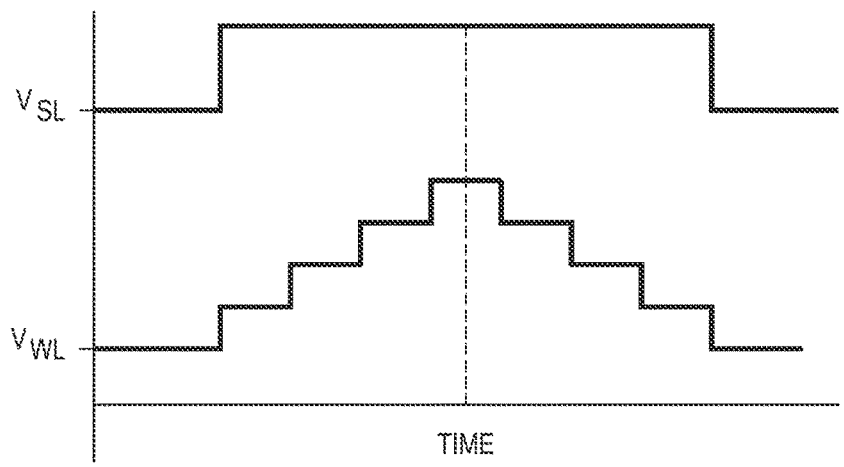

FIG. 5I illustrates a voltage of the word line $V_{WL}$ formed by the superposition of a plurality of square pulses.

Figure 5J:
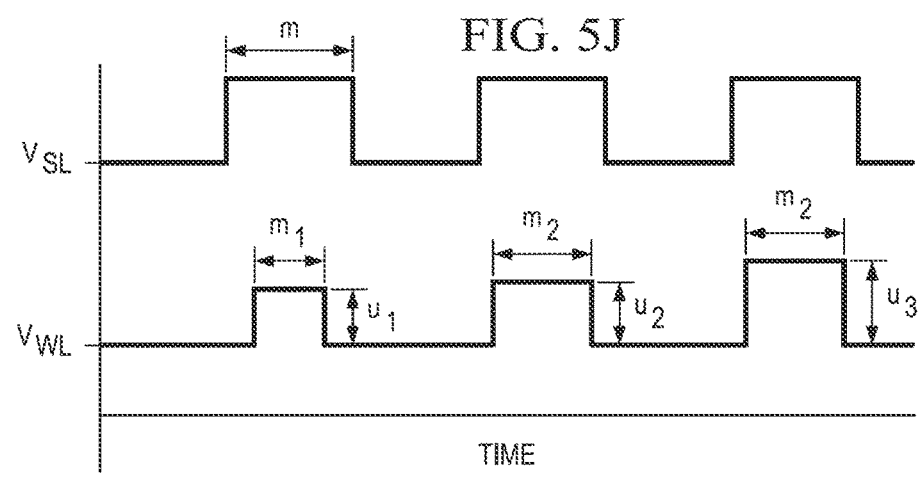

FIG. 5J illustrates embodiments of the invention highlighting a different superposition of a plurality of pulses. In FIG. 5J, a first word line pulse wave having a first peak voltage u1 and a first pulse width m1 may be asserted, a second word line pulse wave having a second peak voltage u2 and a second pulse width m2, and a third word line pulse wave having a third voltage u3 and a third pulse width m3 may be asserted simultaneously. However, each of these word line pulse waves is phase shifted relative to each other. Thus, the peaks of each of these waves may not temporally superimpose over each other. As indicated in FIG. 5J, the pulse widths of each of these waves may also be different. As a consequence, the programming of the memory unit is performed by pulses having incrementally higher peak potential and perhaps incrementally longer pulses.

Figure 5K:
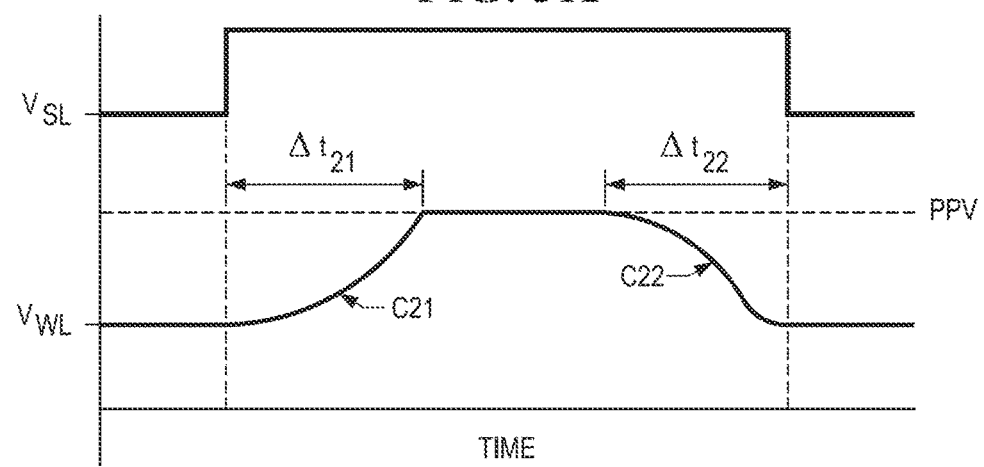

FIG. 5K illustrates an embodiment in which the voltage of the word line $V_{WL}$ comprises a first portion comprising an exponential ramp-up (first WL curve C21), a second portion at a peak program voltage PPV, and a third portion comprising a linear ramp-down (second word line curve C22). Embodiments of the invention may similarly include a parabolic ramp-down in another embodiment. The ramp-up program time Δt21 may not be the same as the ramp-down program time Δt22 in various embodiments, i.e., the word line pulse may be asymmetrical.

Figure 5L:
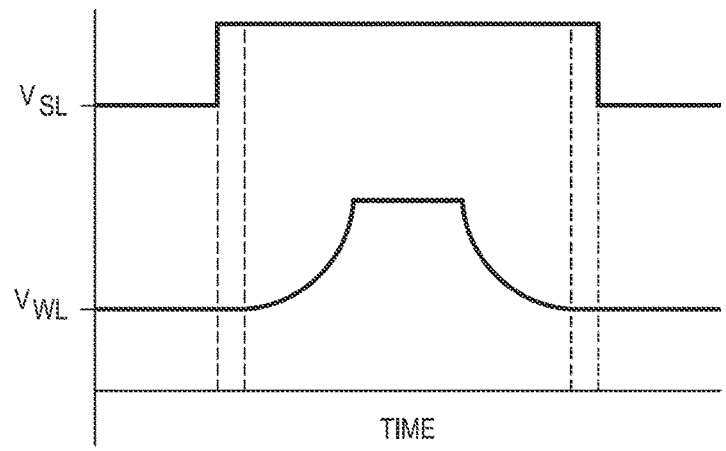

FIG. 5L illustrates an embodiment in which the voltage of the word line $V_{WL}$ is fully encompassed temporally within the select line pulse. Thus, the word line WL independently controls the current flowing through the access device and therefore the programming of the cell. This embodiment may be combined with the embodiments of the invention described in FIGS. 5B-5K.

Figure 6:
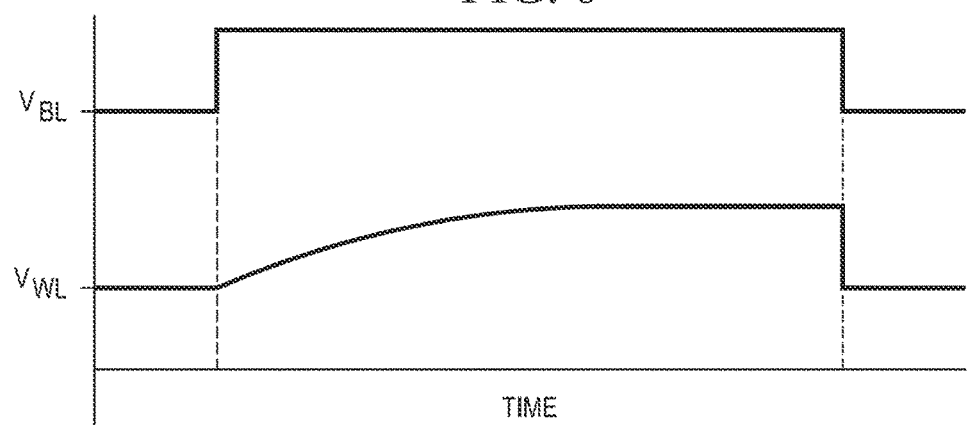
FIG. 6 illustrates a timing diagram of an erase operation highlighting the erase pulses asserted at a word line in accordance with embodiments of the invention.

FIG. 6 illustrates a timing diagram of an erase operation highlighting the erase pulses asserted at a word line in accordance with embodiments of the invention.

The erase operation may be performed similar to the programming pulse except that the potential across the memory unit is reversed. In such an embodiment, the select line may be grounded while the bit line may be pulsed (alternatively the select line may be biased with a negative voltage pulse with the bit line grounded). The word line may be asserted as described previously in FIGS. 5B-5K, which are not reproduced to avoid undue replication. To illustrate, a representative timing diagram is shown. During the voltage of the bit line $V_{BL}$, the word line is asserted with a voltage of the word line $V_{WL}$. As described previously in FIG. 5L, the word line pulse may be fully encompassed temporally within the bit line pulse. Various embodiments of the erase operation may use the profiles described using FIG. 2 (e.g., after inverting) and FIG. 3.

Figure 7A:
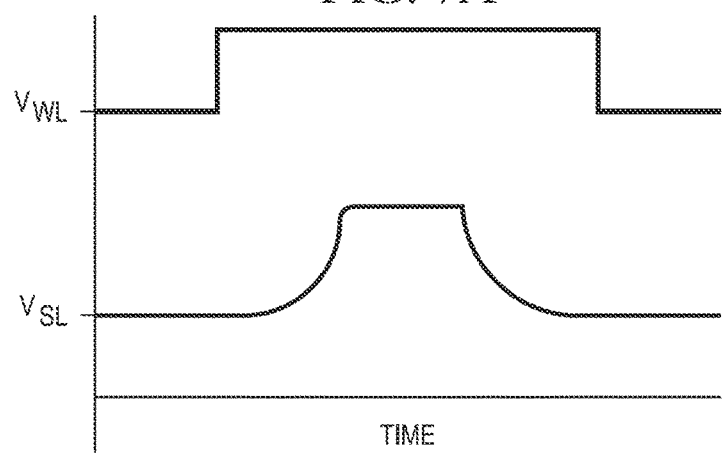
FIGS. 7A and 7B, illustrates an alternative embodiment of programming and erasure in which the ramp profiles are asserted over the bit line and/or select line.
Figure 7B:
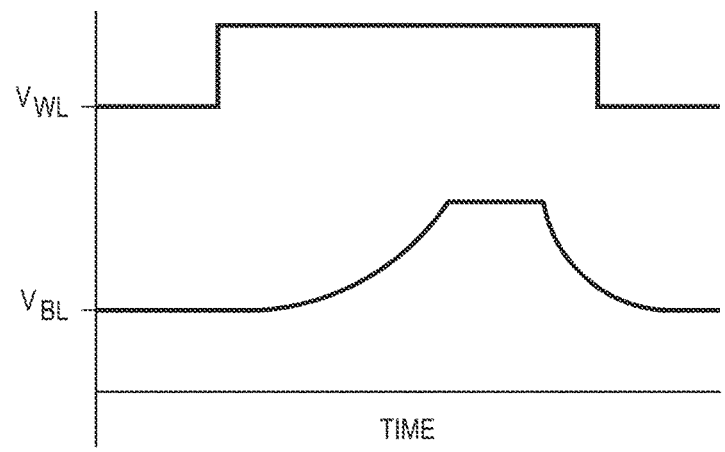

FIG. 7, which includes FIGS. 7A and 7B, illustrates an alternative embodiment of programming and erasure in which the ramp profiles are asserted over the bit line and/or select line.

FIG. 7A illustrates a program operation in accordance with an alternative embodiment of the invention. Referring to FIG. 7A, a programming operation may be performed by ramping the voltage of the word line $V_{WL}$, for example, using a square pulse. The bit line BL may be grounded. Next, the select line is ramped using a ramp profile by applying a voltage on the select line $V_{SL}$. In various embodiments, the select line pulse may be encompassed within the word line pulse. Alternatively, the select line is grounded and the bit line is ramped with a ramp down profile, for example, as illustrated in FIG. 3. The voltage on the select line $V_{SL}$ may have any of the ramp shapes as described in various embodiments, e.g., FIG. 2. Further embodiments may follow one or more of the embodiments described with respect to FIG. 2.

FIG. 7B illustrates an erase operation in accordance with an alternative embodiment of the invention. The erase operation may be performed by grounding the select line and ramping the word line and bit line in one embodiment. The bit line may be ramped as described in one or more embodiments illustrated in FIGS. 2 and 3.

FIG. 8, which FIGS. 8A-8D, illustrates potential advantages of using programming pulses having finite ramp-up rates in accordance with embodiments of the invention.

Figure 8A:
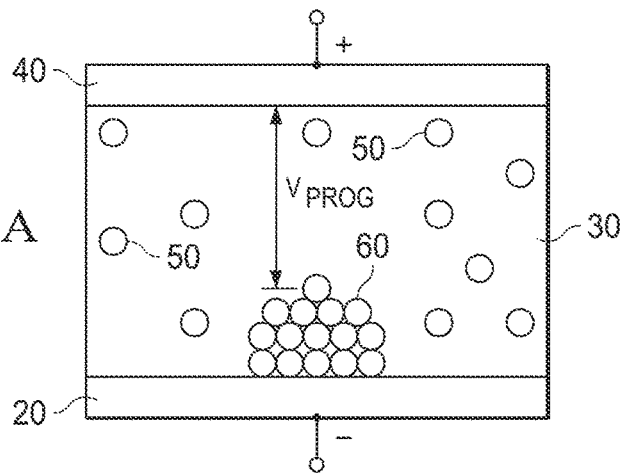
FIGS. 8A-8D, illustrates potential advantages of using programming pulses having finite ramp-up rates in accordance with embodiments of the invention.
Figure 8B:
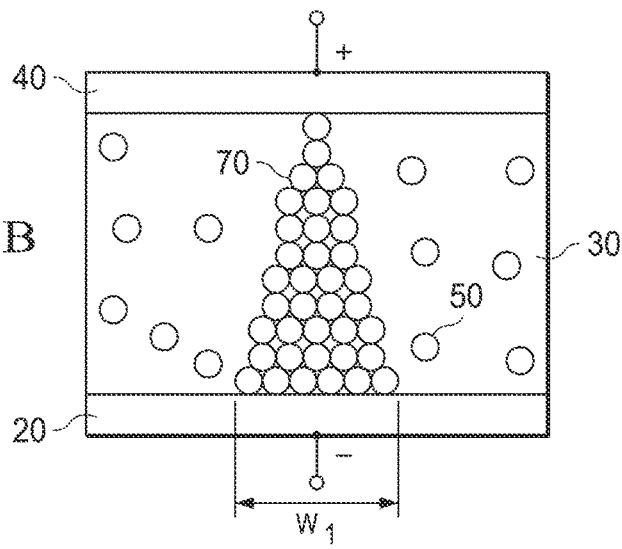
Figure 8C:
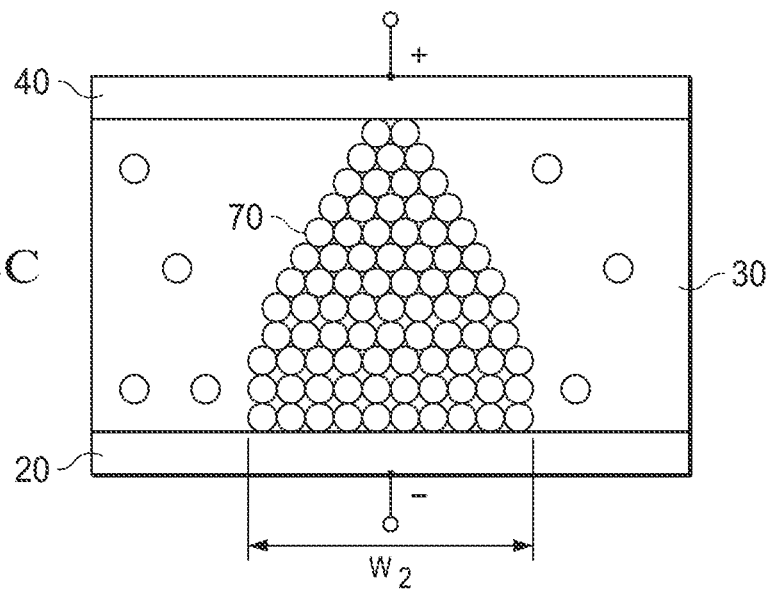

FIG. 8A-8C illustrates a schematic of the memory unit during programming when programming pulses in accordance with embodiments of the invention are applied (e.g., as described in FIG. 2, 5, or 7). FIG. 8 is illustrated for understanding purposes only and the actual physical mechanisms may be more complex.

As illustrated in FIG. 8A, when a positive voltage (programming pulse) is applied across the memory unit, conductive atoms 60 start accumulating over the first conductive layer 20. As both the programming voltage is low during the ramp-up, the programming current is also low. However, as illustrated, much of the applied program voltage $V_{PROG}$ is dropped across the resistive portion of the variable resistance layer 30. Therefore, the subsequent conductive ions may deposit over the nucleated filament because the electric field between the second conductive layer 40 and the growing filament is larger than the electric field between the second conductive layer 40 and the first conductive layer through the remaining variable resistance layer 30. Therefore, the ions that are drifting due to the electric field deposit primarily over the growing filament.

As next illustrated in FIG. 8B, the filament grows towards to the second conductive layer 40 possibly following the path with the maximum electric field. When the filament contacts the second conductive layer 40, the resistance of the variable resistance layer 30 drops due to the formation of the conductive path 70. At this stage, the conductive path 70 has a first bottom width W1.

Referring to FIG. 8C, as further current is passed through the variable resistance layer 30 more conductive atoms from the second conductive layer 40 are deposited. Consequently, the conductive path 70 grows laterally to a second bottom width W2.

In various embodiments, the growth of the conductive path 70 follows a two-step process. First, a thin conductive path 70 is formed between the first and the second conductive layers 20 and 40. Next, the thin conductive path 70 grows laterally becoming thicker in diameter as atoms are deposited.

Ideally, if the program pulse is applied very slowly using a very small voltage above the threshold voltage, a near equilibrium filament may be grown, which is likely to follow the maximum electric field lines. However, due to practical considerations relating to memory performance, the program pulse must be short. Embodiments of the invention enable practically achieving (approach) such quasi-equilibrium growth by the use of ramps during the program pulse. As the ramp-up programming pulse is not ideal, some tributaries may form. However, the ramp-up may enable the formation of primarily a single filament.

Figure 8D:
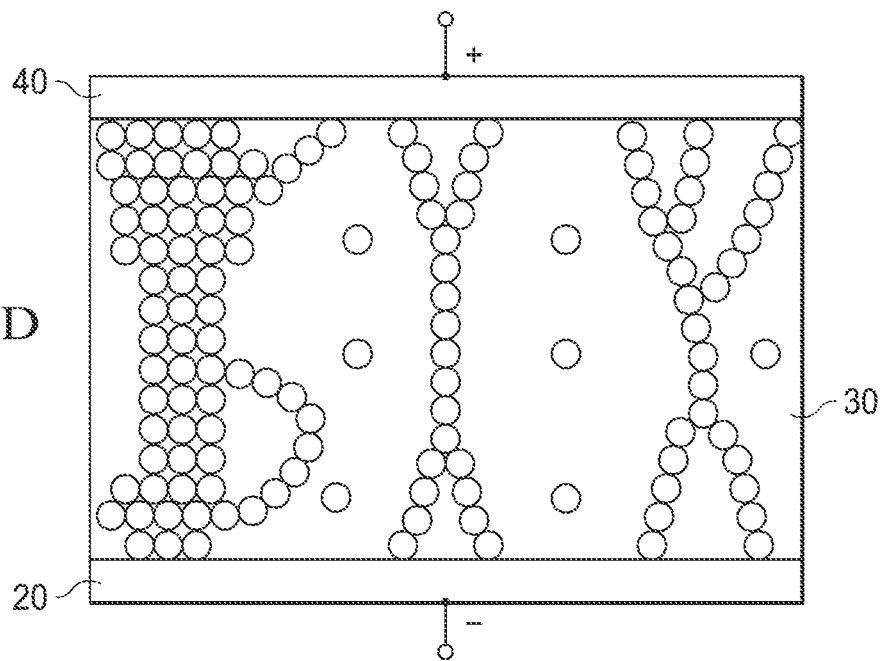

In contrast, as illustrated in FIG. 8D, if a large voltage is applied across the variable resistance layer, the conductive atoms 60 may be deposited over multiple regions not necessarily the regions following the maximum electric field. Thus, as illustrated in FIG. 8D, multiple filaments having multiple tributaries may be formed.

Consequently, the cumulative yield improves significantly when the memory units are subjected to ramp-up programming. In some cases, pulses with exponential ramps may yield better than pulses with linear ramps. This is because of the less random nature of the programming and erasure processes described in FIGS. 8A-8C relative to FIG. 8D.

FIG. 9, which includes FIGS. 9A-9E, illustrates a schematic of the memory unit during erasure when erase pulses are applied in accordance with embodiments of the invention (e.g., as described in FIG. 3, 6, or 7). FIG. 9 is illustrated for understanding purposes only and actual physical mechanisms may be more complex.

Figure 9A:
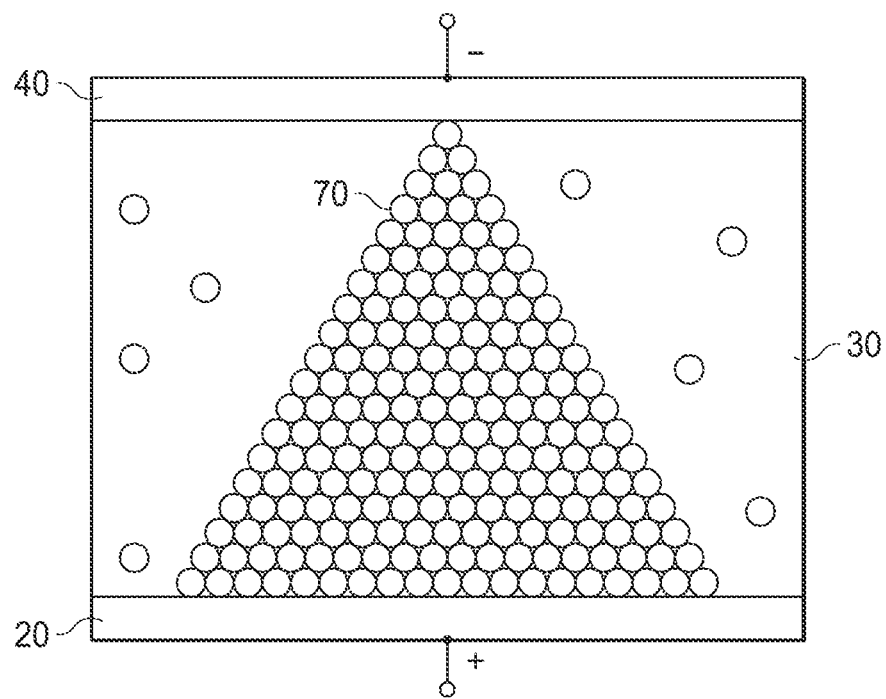
FIGS. 9A-9E, illustrates a schematic of the memory unit during erasure when erase pulses in accordance with embodiments of the invention are applied.

As illustrated in FIG. 9A, prior to the erasure, the memory unit is in a low resistivity state and has a conductive path 70 formed within the variable resistance layer 30. When a negative voltage (erase pulse) is applied across the memory unit, conductive atoms 60 within the variable resistance layer are ionized. These ionized conductive atoms 60 within the variable resistance layer 30 are attracted by the electric field into the second conductive layer 40 and are reduced back to conductive atoms 60 there. In particular, as the resistivity of the conductive path 70 decreases towards the first conductive layer 20 (e.g., diameter of the conductive path 70 likely increases), the potential drop is maximum at the tip of the conductive path 70 adjacent the second conductive layer 40. Thus, the conductive path 70 begins to dissolve from the surface adjacent the second conductive layer 40.

Figure 9B:
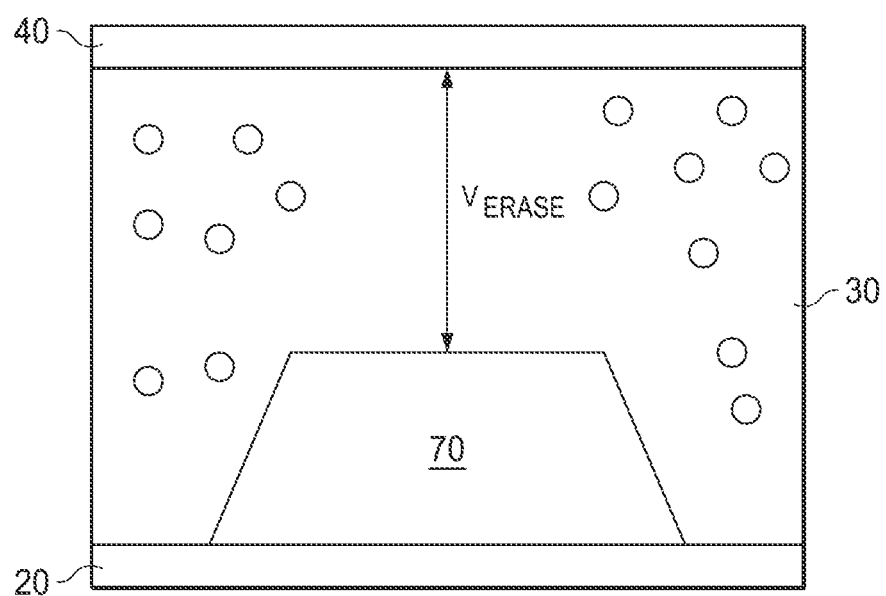
Figure 9C:
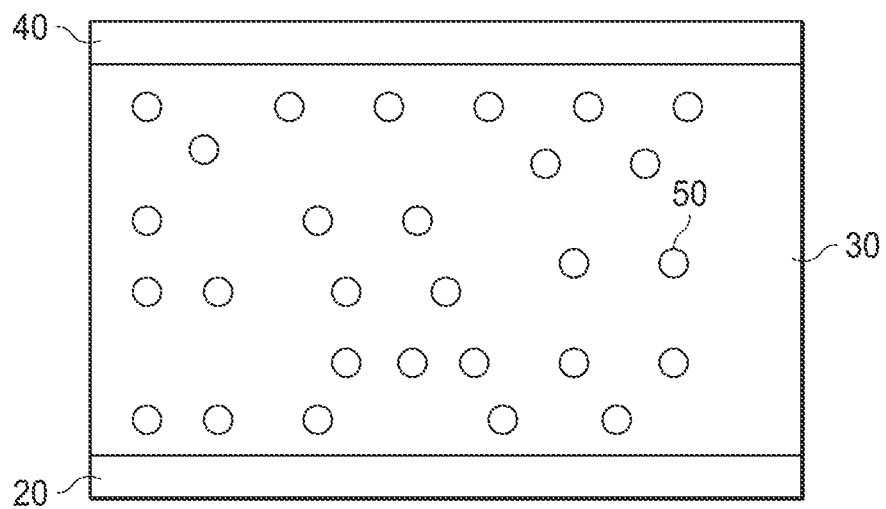

As illustrated in FIG. 9B, much of the applied erase voltage $V_{ERASE}$ is dropped across the resistive portion of the variable resistance layer 30. Therefore, subsequent conductive atoms 60 are dissolved from the top surface of the conductive path 70. As the erase voltage is low during the ramp-down, the erase current is also low. The small number of atoms being dissolved primarily come from this top surface of the conductive path 70. Thus a slow ramp-down is likely to be closer to an equilibrium process. Consequently, as illustrated in FIG. 9C, all the conductive atoms 60 in the conductive path 70 dissolve and are reabsorbed at the second conductive layer 40.

Figure 9D:
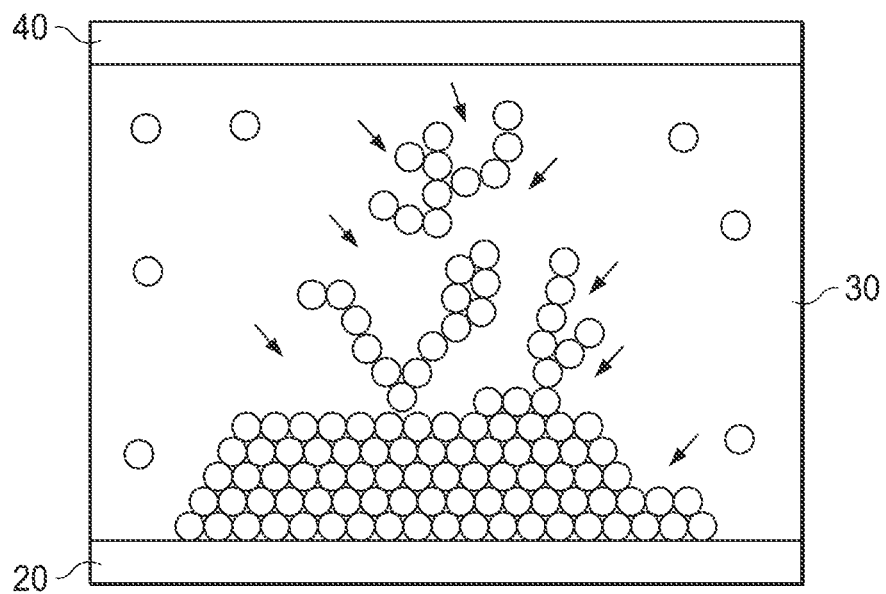
Figure 9E:
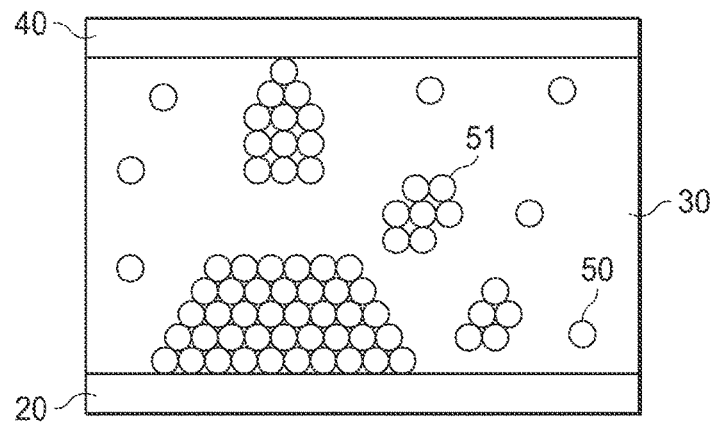

In contrast, if a large erase voltage is applied as illustrated in FIG. 9D, a large current is forced through the variable resistance layer 30. This forces a large number of conductive atoms 60 to be dissolved simultaneously from the conductive path 70. As illustrated in FIG. 9D, this process will be further from an equilibrium process and conductive atoms 60 from different parts of the conductive path 70 may dissolve. As next illustrated in FIG. 9E, such dissolution will likely result in a defective structure in which the variable resistance layer comprises defects 51 after the erase process. These defects 51 may comprise clusters of conductive atoms 60 or may be artifacts of the destructive nature of the erase process. When such a memory unit having defects is programmed/erased during normal operation, the memory unit will likely result in poor programming and/or erasure. As a consequence, compared to a standard square pulse, a pulse having a ramp may improve cumulative yield, tighten the spread in resistance, and/or increase the resistance after erasure.

Further, embodiments of the inventions, e.g., including ramp ups and ramp downs described above, may be applied to other operations of the memory device including read operations, refresh operations, and/or auto disturb operations.

Figure 10A:
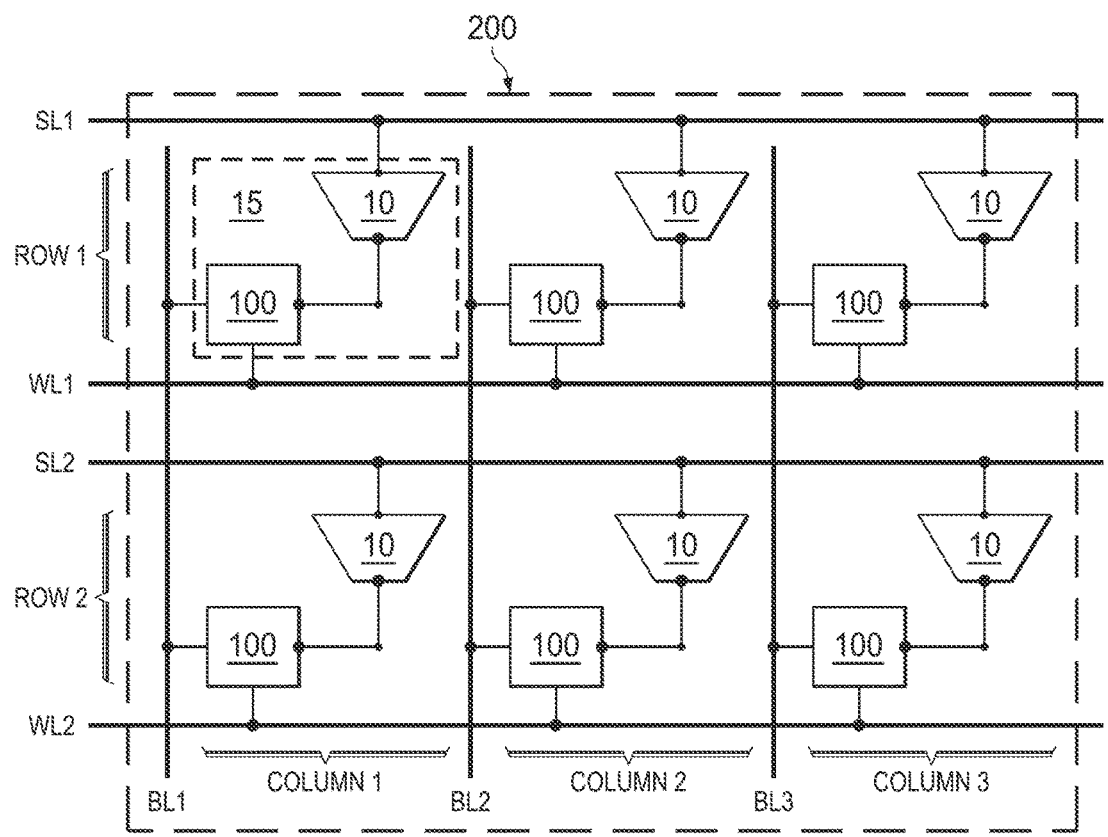
FIGS. 10A and 10B, illustrates various memory cell array implementing embodiments of the invention.
Figure 10B:
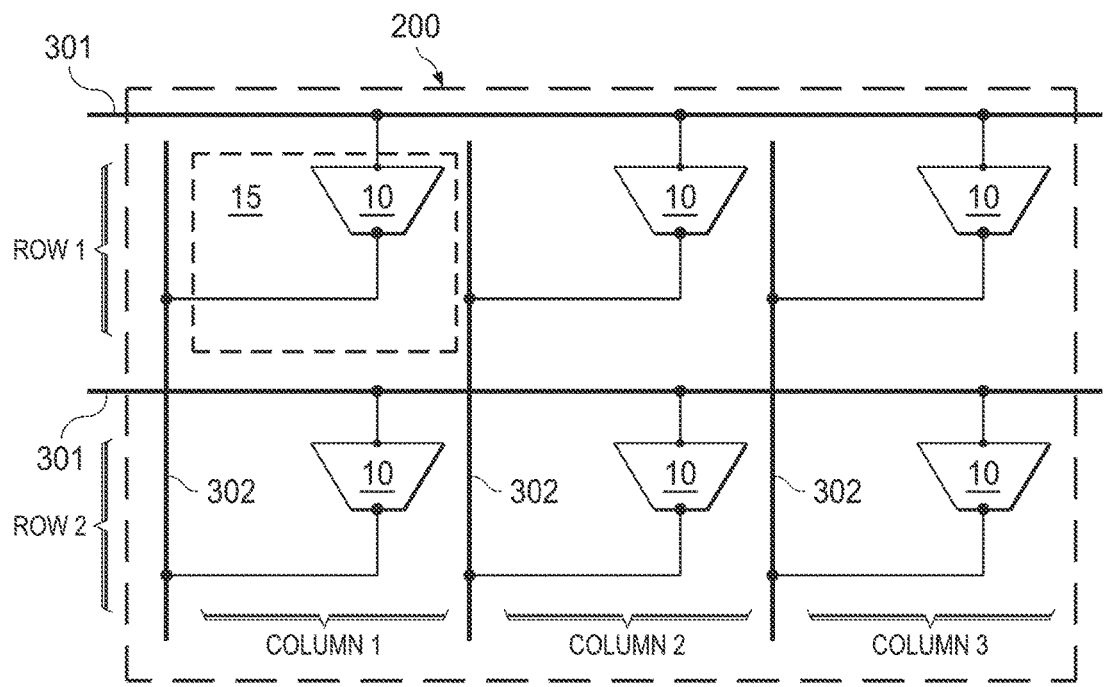

FIG. 10, which includes FIGS. 10A and 10B, illustrates various memory cell array implementing embodiments of the invention.

A memory cell array 200 may be formed using the memory unit 10 implementing the various embodiments described above. The memory unit 10 may be formed as described in FIGS. 1 and/or 4. In one embodiment illustrated in FIG. 10A, a memory cell array 200 may be formed from the memory cell 15 comprising an access device 100 and a memory unit 10 as described previously with respect to FIG. 4 and operationally with respect to FIGS. 5-7.

In an alternative embodiment, the memory cell array 200 may be implemented as a cross-point memory array, for example, as a stacked memory array. The memory unit 10 may include a switching device, e.g., a diode, and a resistor within the same device in one such embodiment. Such arrays may also be used to form logic devices in some embodiments. The memory unit 10 is coupled between a first plurality of lines 301 and a second plurality of lines 302. The first and the second plurality of lines 301 and 302 may be perpendicular to each other. The memory unit 10 may be coupled to a first line of the first plurality of lines 301 in a first metal level to a first line of the second plurality of lines 302 in a metal level vertically above or below the first metal level.

FIG. 11, which includes FIGS. 11A-11D, illustrates a memory device implementing embodiments of the invention.

Figure 11A:
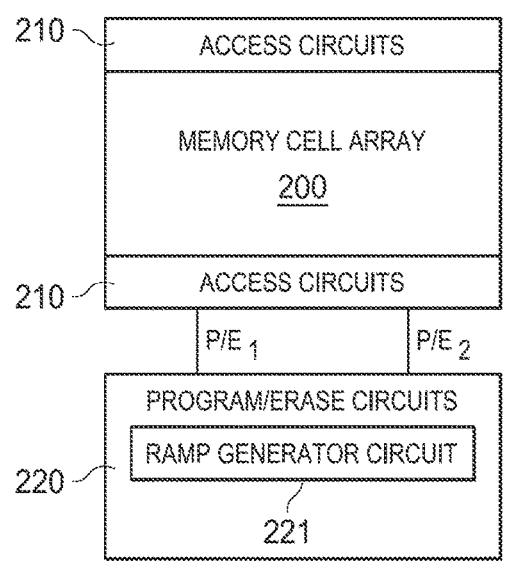
FIGS. 11A-11D, illustrates a memory device implementing embodiments of the invention.

Referring to FIG. 11A, the memory device comprises a memory cell array 200 (e.g., as described in FIG. 10), access circuits 210, and program/erase circuits 220. The memory cell array 200 may comprise a plurality of memory units 10 as described previously. The access circuits 210 provide electrical connections to the memory cell array 200 so that the memory units 10 may be programmed, erased, and read. The access circuits 210 may be located on one or more sides of the memory cell array 200. For example, the access circuits 210 may be located on opposite sides such that the potential may be applied across the memory units. The access circuits 210 may comprise the word line, bit line, and select line drivers described in FIG. 4 as an example.

The program and erase circuits 220 may provide program and erase signals (e.g., P/E$_1$, P/E$_2$) to the access circuits 210, which applies them to the memory cell array 200. The program and erase signals may include the ramp profiles as described in various embodiments in FIGS. 2, 3, and 5-7. The program and erase signals may comprise external or internal circuits to enable generation of ramp profile voltage sources. In one embodiment, the program and erase circuits 220 comprises a ramp generator 221 for generating the ramp-up and ramp-down program or erase pulses. The ramp generator 221 may comprise pulse, function, or signal generators. In one embodiment, the ramp generator 221 comprises a constant current source charging a capacitor so as to obtain a ramp-up. In one embodiment, the ramp generator 221 comprises a comparator to cut-off the current source when a predetermined voltage is achieved. In various embodiments, the ramp generator 221 may comprise any suitable circuits known to a person having ordinary skill in the art. In some embodiments, a current mirror circuit may be used to dynamically maintain a maximum current passing through the memory unit.

The peak program or erase voltage may be higher than or lower than a supply voltage. The program and erase circuits may include charge pump circuits for generating higher than supply voltages, or step down voltage regulators and the like generating lower than supply voltages. The program and erase circuits may also receive one or more of the program and erase signals from an external circuit in some embodiments. In some embodiments, the program and erase circuits may comprise program circuits physically separate from the erase circuits.

Figure 11B:
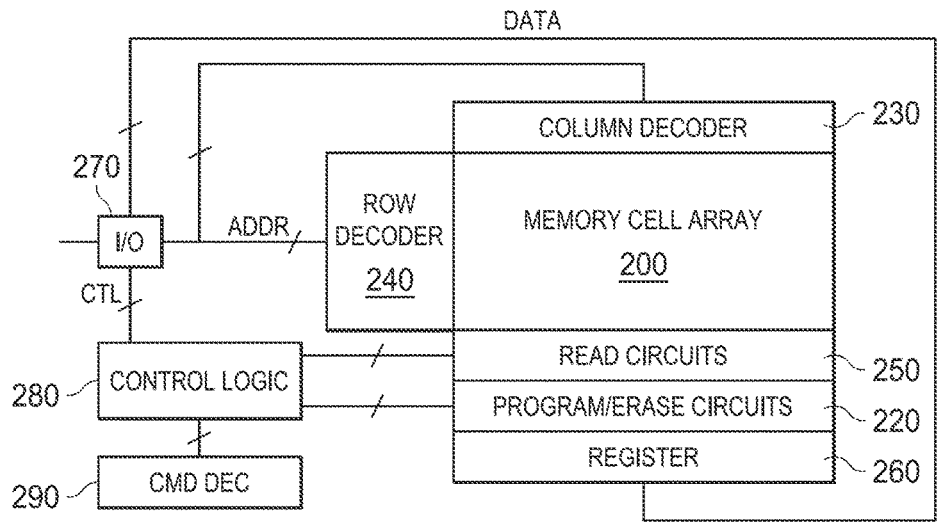

FIG. 11B illustrates a further embodiment of the memory device. The memory device includes the program and erase circuits 220 and memory cell array 200 as described in FIG. 11A. The memory device may differ from the prior embodiment in that the access circuits may include a column decoder 230 and a row decoder 240. In response to an address data, the column and the row decoders 230 and 240 may select group of memory cells for reading, programming, erasing. Further, the memory device may comprise read circuits 250 separate from the program and erase circuits 220. The read circuits 250 may include current and/or voltage sense amplifiers. The memory device may further include a register 260 for storing read data values from the memory cell array 200 or to store data to be written into the memory cell array 200. In various embodiments, the register 260 may input and output data in parallel (i.e., bytes, words, and others). In some embodiments, the register 260 may be accessed by serial data paths.

Input/output (I/O) circuits 270 may receive address values and write data values, and output read data values. The received address values may be applied to column and row decoders 230 and 240 to select memory cells. Read data from the register 260 may be output over the I/O circuits 270. Similarly, write data on I/O circuits 270 may be stored in registers 260. A command decoder 290 may receive command data, which may be passed on to the control logic 280. The control logic 280 may provide signals to control various circuits of the memory device.

Figure 11C:
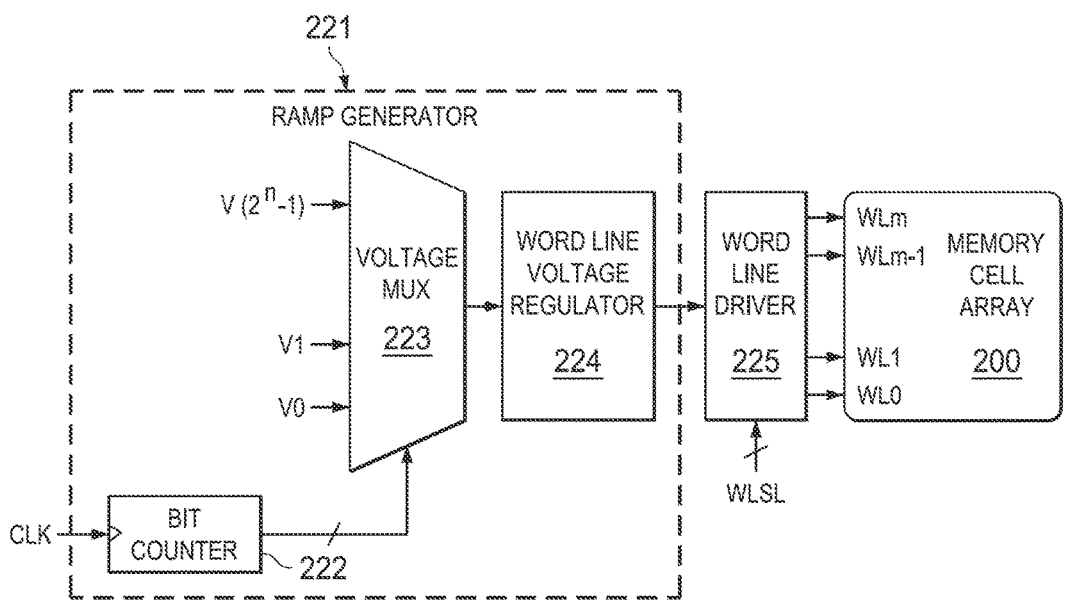

FIG. 11C illustrates one way of implementing the ramp generator circuit described previously in various embodiments. In one or more embodiments, a memory system comprises a ramp generator 221. The ramp generator 221 comprises a bit counter 222 having a clock signal input CLK. The clock signal input CLK may be generated at a clock divider from a standard clock signal. The clock signal input CLK may be a frequency multiple of a standard clock signal in one or more embodiments. The bit counter 222 outputs a word line voltage selection bit into the voltage multiplexer 223. The bit counter 222 may change the value of the word line voltage selection bit at each rise or fall of the clock signal input CLK.

The voltage multiplexer 223 has a plurality of voltage inputs, for example, V0, V1, . . . V($2^n$–1). Each of the plurality of voltage inputs may be tied to a different potential. The voltage multiplexer 223 selects one of the plurality of voltage inputs as the output voltage based on the value of the word line voltage selection bit. Thus, at every rise or fall in the clock signal input CLK, a different voltage may be outputted by the voltage multiplexer 223. Thus, the voltage from the voltage multiplexer 223 resembles a step function based voltage (e.g., as illustrated in FIG. 2H or 3G). Thus, any suitable voltage profile may be generated.

The output of the voltage multiplexer 223 may be inputted into a word line driver 110. In one or more embodiments, a word line (WL) voltage regulator 224 may be used as an intermediary. The voltage regulator 224 may further modify the output of the voltage multiplexer 223, for example, by stepping up and/or smoothing.

The word line driver 110 thus receives a ramp profile from the ramp generator 221. Depending on the value of the word line select line (WLSL), the word line driver 110 may assert this voltage on one of the plurality of word lines (e.g., WL0, WL1, . . . , WLm−1, WLm), and, for example, accordingly on one of the memory cells of the memory cell array 200.

Figure 11D:
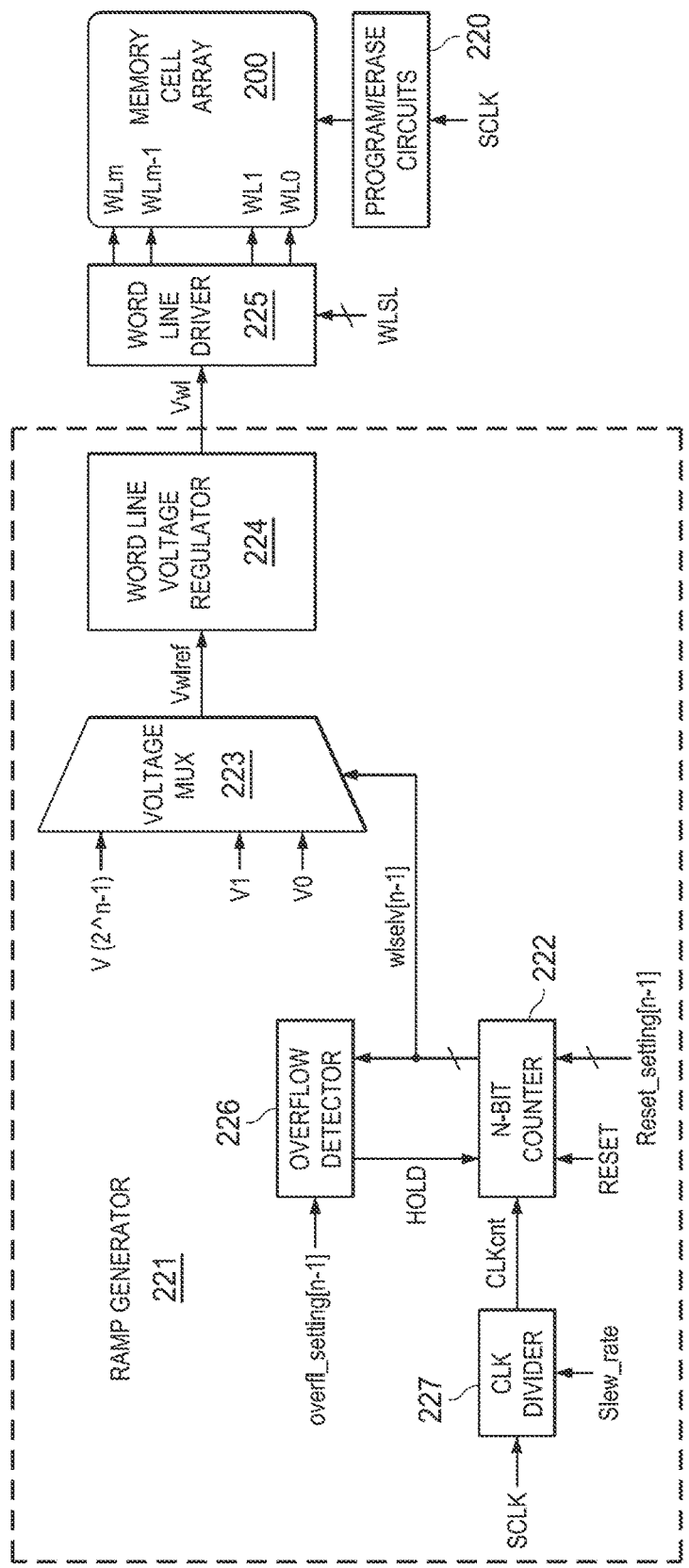

FIG. 11D illustrates a further embodiment of implementing the ramp generator circuit described previously.

In addition to the circuit described in FIG. 11C, the ramp generator 221 may include a clock divider 227, which takes a standard clock signal SCLK and the slew rate to produce a higher frequency clock signal CLKcont, which is input to the bit counter 222. An overflow detector 226 monitors the output from the bit counter 222 and maintains the counter from going up or going down. For example, this ensures that the value of the word line select line bit from the bit counter 222 does not exceed a corresponding value for a maximum final word line voltage. Similarly, this also ensures that the counter is reset to the initial voltage after a full cycle of the standard clock signal SCLK.

As illustrated, the program/erase circuits 220 may also use the clock signal SCLK such that the output from the voltage multiplexer changes at a frequency much higher than the write/erase pulse, which is timed by the standard clock signal SCLK. The read circuits may also perform the read operations using the standard clock signal SCLK.

Figure 12:
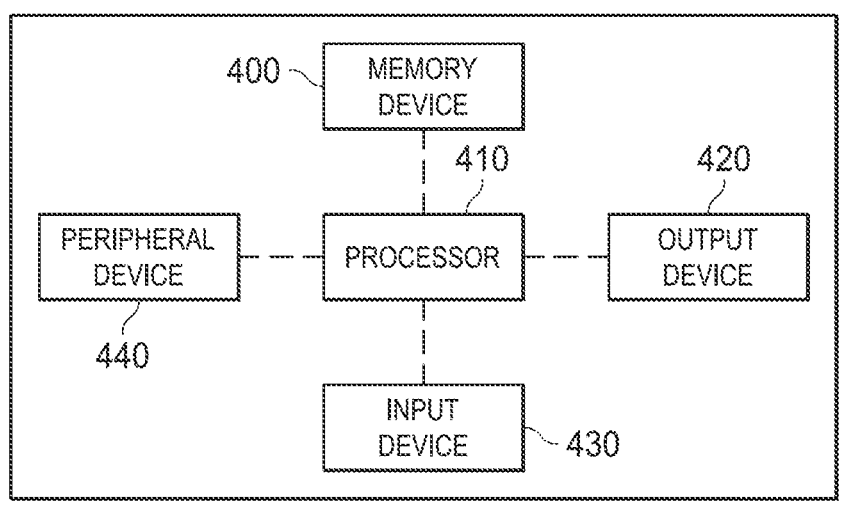
FIG. 12 illustrates a schematic block diagram of a system implementing embodiments of the invention.

FIG. 12 illustrates a schematic block diagram of a system implementing embodiments of the invention.

As illustrated in FIG. 12, the system may comprise the memory device 400 a processor 410, and output device 420, an input device 430, and optionally a peripheral device 450. The memory device 400 may be formed as described in FIG. 11 in one or more embodiments and may comprise a plurality of memory units.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 2-12 may be combined in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a two terminal resistive switching device having a first terminal and a second terminal and having a first state and a second state;
   a signal generator configured to generate a signal, the signal comprising
      a first ramp voltage from a first voltage to a second voltage over a first time period,
      a second ramp voltage from the second voltage to a third voltage over a second time period, wherein the second ramp voltage has an opposite slope to the first ramp voltage, wherein the first time period is at least 0.1 times a total time period of the first time period plus the second time period, and wherein the second time period is at least 0.1 times the total time period of the first time period plus the second time period; and
   an access circuit configured to apply the signal on the first terminal, the access circuit being coupled to the signal generator, wherein the resistive switching device is configured to change from the first state to the second state in response to the signal.

2. The device of claim 1, wherein the resistive switching device comprises a logic device.

3. The device of claim 1, wherein the resistive switching device comprises a resistive switching memory.

4. The device of claim 3, wherein the resistive switching device comprises an ionic memory.

5. The device of claim 4, wherein the ionic memory comprises a solid electrolyte layer disposed between an inert electrode and an electrically active metal electrode.

6. The device of claim 3, wherein the resistive switching device comprises a phase change random access memory or a metal oxide based resistive random access memory.

7. The device of claim 1, wherein the first ramp voltage comprises a linear, parabolic or exponential change from the first voltage to the second voltage.

8. The device of claim 1, wherein the first ramp voltage comprises a saw-tooth, triangular shape, or super imposed squares.

9. The device of claim 1, wherein the first ramp voltage is asymmetrical along time.

10. The device of claim 1, wherein the signal generator is configured to generate a third ramp voltage from a third voltage to a fourth voltage over a third time period.

11. The device of claim 10, wherein the third voltage is about the same as the first voltage.

12. The device of claim 10, wherein the fourth voltage is about the same as the second voltage.

13. The device of claim 10, wherein the third voltage is different from the first voltage.

14. The device of claim 10, wherein the fourth voltage is different from the second voltage.

15. The device of claim 1, wherein the first ramp voltage and the second ramp voltage is applied between the first terminal and the second terminal.

16. The device of claim 1, further comprising an access device, wherein the second terminal of the resistive switching device is coupled to the access device.

* * * * *